(12) United States Patent
Murayama et al.

(10) Patent No.: US 7,282,160 B2
(45) Date of Patent: Oct. 16, 2007

(54) LIGHT EMITTING DEVICE AND FLUORESCENT MATERIAL

(75) Inventors: Tetsuo Murayama, Kanagawa (JP); Akiko Yabe, Kanagawa (JP); Kanzi Shimizu, Kanagawa (JP); Takayuki Shoda, Kanagawa (JP); Masahiko Yoshino, Kanagawa (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 11/283,870

(22) Filed: Nov. 22, 2005

(65) Prior Publication Data

US 2006/0172148 A1    Aug. 3, 2006

Related U.S. Application Data

(63) Continuation of application No. PCT/JP2004/007331, filed on May 21, 2004.

(30) Foreign Application Priority Data

May 22, 2003  (JP) .......................... P.2003-144388

(51) Int. Cl.
    *H01J 61/44* (2006.01)
(52) U.S. Cl. ............... 252/301.16; 257/98; 313/504
(58) Field of Classification Search ............... 257/98; 428/690; 252/301.16
    See application file for complete search history.

(56) References Cited

U.S. PATENT DOCUMENTS

| 6,051,925 A | | 4/2000 | Boerner et al. | |
| 6,084,250 A | | 7/2000 | Justel et al. | |
| 6,165,631 A | * | 12/2000 | Boerner et al. | ............. 428/690 |
| 6,410,169 B1 | | 6/2002 | Justel et al. | |
| 2004/0137265 A1 | * | 7/2004 | Shimada et al. | ............. 428/690 |

FOREIGN PATENT DOCUMENTS

| JP | 7-206881 | | 8/1995 |
| JP | 10-012925 | | 1/1998 |
| JP | 11-339962 | | 12/1999 |
| JP | 2000-063682 | * | 2/2000 |
| JP | 2000-509912 | | 8/2000 |
| JP | 2000-256251 | | 9/2000 |
| JP | 2002-88282 | | 3/2002 |
| JP | 2002-124383 | | 4/2002 |
| JP | 2002-163902 | | 6/2002 |
| JP | 2002-170684 | | 6/2002 |
| JP | 2003-515897 | | 5/2003 |
| JP | 2004-356358 | * | 12/2004 |
| WO | WO 02/43446 A1 | | 5/2002 |
| WO | WO 2002/091487 | * | 11/2002 |

* cited by examiner

OTHER PUBLICATIONS

U.S. Appl. No. 11/289,376, filed Nov. 30, 2005, Shimizu et al.

*Primary Examiner*—C. Melissa Koslow
(74) *Attorney, Agent, or Firm*—Oblon, Spivak, McClelland, Maier & Neustadt, P.C.

(57) ABSTRACT

The present invention is to provide a light emitting device which can generate high-intensity light emission, using a fluorescent material containing a rare earth element ion complex and being excellent in durability and also provide the fluorescent material to be used therein. The present invention relates to a light emitting device comprising a semiconductor light emitting element which emits light within the region from near-ultraviolet light to visible light, and a fluorescent material which contains a rare earth element ion complex having an aromatic ring-containing Bronsted acid ion with a pKa value of 7 or less as a ligand and emits light by the action of light of the semiconductor light emitting element.

12 Claims, 2 Drawing Sheets

LIGHT EMISSION MECHANISM OF Eu COMPLEX

LIGHT EMITTING DEVICE AND FLUORESCENT MATERIAL

TECHNICAL FIELD

The present invention relates to a light emitting device and a fluorescent material, and more particularly to a light emitting device in which a semiconductor light emitting element is combined with a fluorescent material, and the fluorescent material used therein.

BACKGROUND ART

Light emitting devices in which light of a discharge lamp or a semiconductor light emitting element is color converted with a fluorescent material have hitherto been used for illumination and the like. In order to generate lights of various colors such as white, in a wide color reproduction range, uniformly with a good color rendering property by mixing blue, red and green color lights, many studies have been made for these light emitting devices. Above all, light emitting devices using a semiconductor light emitting element such as a light emitting diode (LED) or a semiconductor laser (LD) have high luminous efficiency and also have an advantage in terms of environmental protection such as no use of mercury. Accordingly, the development of light emitting devices in which an LED or an LD is combined with a fluorescent material has been actively carried out.

In particular, light emitting devices in which an LED or an LD is combined with an organic red fluorescent material comprising a europium (Eu) complex having an anion of a β-diketone as a ligand have been reported as devices which efficiently absorb light from near-ultraviolet light to visible light and provide high-luminance light emission, compared to a fluorescent lamp using an inorganic red fluorescent material such as $Y_2O_3$:Eu (see patent document 1 and patent document 2).

Patent Document 1: JP 10-12925 A
Patent Document 2: JP 2000-509912 A

DISCLOSURE OF THE INVENTION

However, the organic red fluorescent material comprising a europium (Eu) complex having an anion of a β-diketone as a ligand, as reported in patent document 1 and patent document 2, shows a performance of easily suffering from photo-degradation, and its light emitting ability rapidly decreases to cause the difficulty of using for a long period of time. Accordingly, the necessity of improving durability has arisen.

The causes of easy photo-degradation on the organic red fluorescent material comprising a europium (Eu) complex having an anion of a β-diketone as a ligand have been examined. As a result, it has become clear that easy dissociation of the β-diketone ligand is one factor. The present inventors have made extensive studies of ligands difficult to be dissociated, and have discovered that a Bronsted acid (anion) derived from an aromatic ring-containing Bronsted acid represented by general formula (1) shown below, which is a stronger acid than the β-diketone, forms a more stable complex with a rare earth element ion such as a europium ion than the β-diketone anion to result in difficulty of photo-degradation, and that it emits light by the action of light of a semiconductor light emitting element, thereby arriving at the present invention:

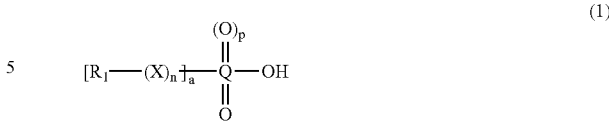

wherein $R_1$ is a group containing at least one aromatic hydrocarbon ring or aromatic heterocycle, each optionally having a substituent group, X is a divalent connecting group, Q represents a carbon, sulfur or phosphorous atom, a represents 1 or 2, n represents 0 or 1, and p represents 0 or 1.

The β-diketone anion is an ion formed by dissociation of a hydrogen ion (proton) from the β-diketone, and the β-diketone also corresponds to a kind of Bronsted acid. However, the pKa value, a measure of acid strength, of acetylacetone which is a typical β-diketone is reported to be 9.3 (Iwanami Koza, *Gendai Kagaku* (Modern Chemistry) 9, edited by Michinori Oki and Motoharu Tanaka, "Acid-Base and Oxidation-Reduction", page 34, published by Iwanami Shoten (1979)), and that of dibenzoylmethane is reported to be 8.59 (*Kagaku Binran* (Handbook of Chemistry) *Kiso-hen II*, 5th revision, edited by The Chemical Society of Japan, page 342, published by Maruzen Co., Ltd. (2004)), and both are weak acids. In order to stabilize the complex, it can be considered that a stronger ionic bond between a rare earth element ion and a ligand ion is desirable. Considering that a stronger acid is desirable, extensive studies have been made. As a result, it has been found that among Bronsted acids with a pKa value of 7 or less which are stronger acids than the β-diketone, an aromatic ring-containing Bronsted acid represented by the above-mentioned general formula (1) is resistant to photo-degradation and solves the problem.

The acid strength of the Bronsted acid which dissociates a proton is indicated by $pK_a$, the reciprocal of the logarithm of the equilibrium constant at the time when it dissociates the proton in an aqueous solution. The $pK_a$ is described in many textbooks, handbooks, encyclopedias and the like such as the above-mentioned "Acid-Base and Oxidation-Reduction", page 27 and "Kagaku Binran Kiso-hen II, 5th revision", page 331. The $pK_a$ values of typical Bronsted acids are described in these books.

The aromatic ring-containing Bronsted acids include many acids slightly soluble in water. For those acids, the acid strength in the aqueous solution can be relatively determined by comparing the $pK_a$ value in a mixed solvent of water and an organic solvent such as ethanol or in a nonaqueous solvent such as methanol, ethanol or dimethyl sulfoxide with the Bronsted acid whose $pK_a$ value in the aqueous solution has been known.

Accordingly, the present invention has been made in order to solve the problem which has stood out in relief at the time of developing the light emitting device using the organic red fluorescent material which comprises the Eu complex having such an organic anion as the ligand. That is, objects of the present invention are to provide a light emitting device which can generate high-intensity light emission, using a fluorescent material containing a rare earth element ion complex and being excellent in durability, particularly a red fluorescent material containing a Eu complex, and also provide a lighting system using the same, and the fluorescent material used therein.

Thus, the light emitting device to which the present invention is applied uses a fluorescent material which contains a rare earth element ion complex having an aromatic ring-containing Bronsted acid ion with a pKa value of 7 or less as a ligand. That is, the light emitting device to which the present invention is applied comprises a semiconductor light emitting element which emits light within the region from near-ultraviolet light to visible light, and a fluorescent material which contains a rare earth element ion complex having an aromatic ring-containing Bronsted acid ion with a pKa value of 7 or less as a ligand and emits light by the action of light of this semiconductor light emitting element.

In the light emitting device to which the present invention is applied, the semiconductor light emitting element is preferably a laser diode or light emitting diode having a peak wavelength within the range of 360 nm to 470 nm. Further, when the ligand in the rare earth element ion complex contained in the fluorescent material is one in which the triplet energy of a mother compound of the Bronsted acid ion is higher than the excited-state energy level of the rare earth element ion, a light emitting device in which the fluorescent material efficiently emits light by the action of light of the semiconductor light emitting element is obtained. Also, it is preferred that the fluorescent material contains a rare earth element ion complex having as the ligand a Bronsted acid ion represented by the following general formula (2):

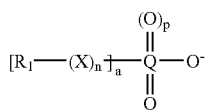
(2)

wherein $R_1$ is a group containing at least one aromatic hydrocarbon ring or aromatic heterocycle, each optionally having a substituent group, X is a divalent connecting group, Q represents a carbon, sulfur or phosphorous atom, a represents 1 or 2, n represents 0 or 1, and p represents 0 or 1.

Of such fluorescent materials, it is preferred that a rare earth element ion complex having an aromatic ketone group-containing Bronsted acid ion as a ligand is contained. Further, it is usually preferred in terms of luminance improvement that the fluorescent material contains a rare earth element ion complex having a Lewis base as an auxiliary ligand. This fluorescent material is preferably a resin composition in which the rare earth element ion complex is mixed or dispersed.

Furthermore, the light emitting device to which the present invention is applied further comprises another fluorescent material which emits light by the action of light of the semiconductor light emitting element, together with the fluorescent material containing the rare earth element ion complex. For example, when the rare earth element ion complex of the present invention develops a red color, further inclusion of a blue fluorescent material and a green fluorescent material, each of which emit light by the action of light of the semiconductor light emitting element, makes it possible to emit white light having reproducibility of a color close to natural light. Thereby, it becomes possible to provide a lighting system equipped with the light emitting device to which the present invention is applied.

Further, referring to the cases where the semiconductor light emitting element is a blue light emitting element, for example, when the rare earth element ion complex of the present invention emits a red color, it becomes possible by combination with a green fluorescent material to emit white light excellent in color rendering properties, compared to pseudo-white light of only a yellow fluorescent material.

On the other hand, the present invention can be grasped as a fluorescent material containing a rare earth element ion complex having a Bronsted acid ion represented by the following general formula (2) as a ligand:

(2)

wherein $R_1$ is a group containing at least one aromatic hydrocarbon ring or aromatic heterocycle, each optionally having a substituent group, X is a divalent connecting group, Q represents a carbon, sulfur or phosphorous atom, a represents 1 or 2, n represents 0 or 1, and p represents 0 or 1.

Further, the rare earth element ion complex preferably has a Lewis base as an auxiliary ligand.

Furthermore, the above-mentioned Bronsted acid ion is preferably a carboxylic acid or a sulfonic acid, and the above-mentioned rare earth element ion complex is preferably a europium complex or a terbium complex.

Figure 1:
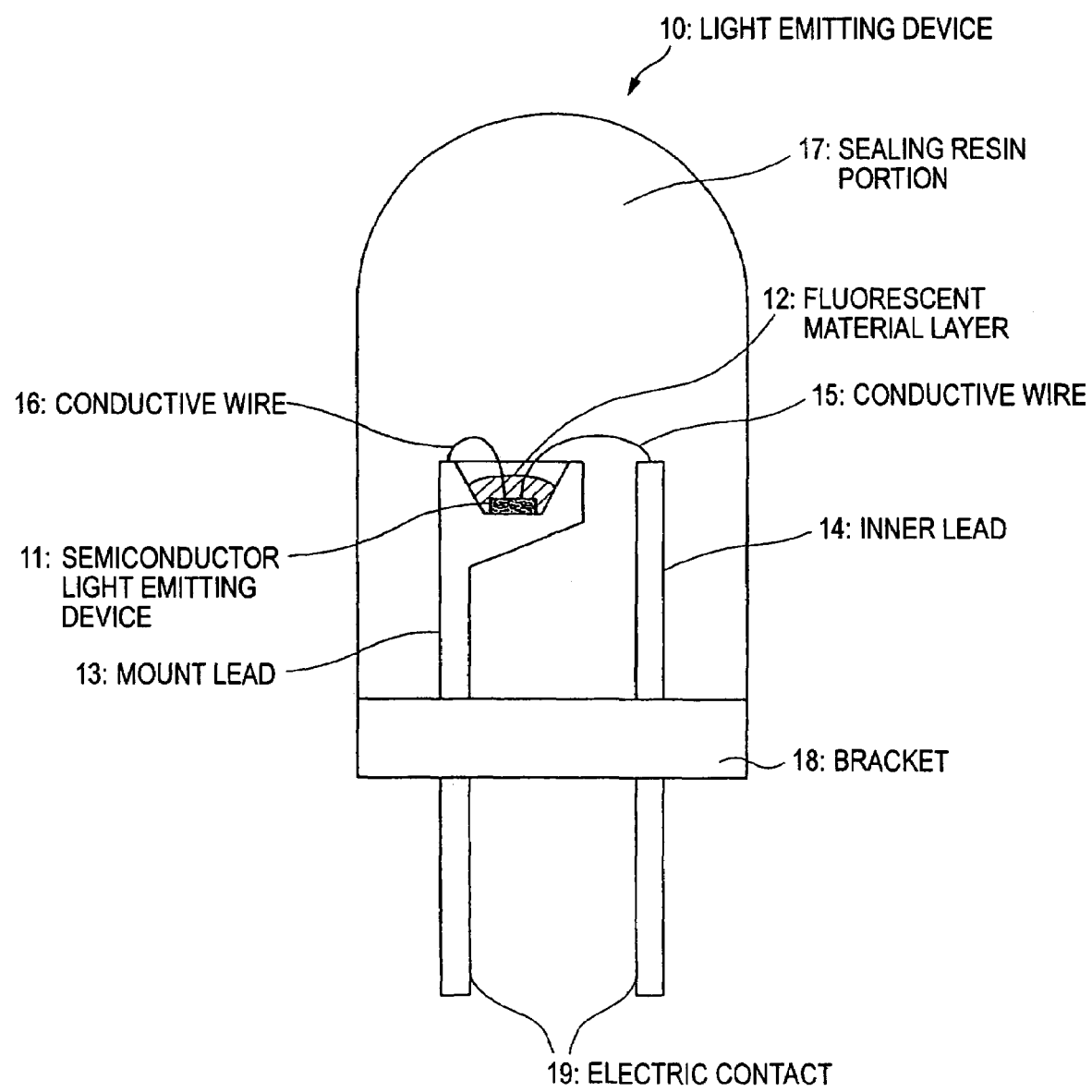
FIG. 1 is a view for illustrating a light emitting device in this embodiment.

As for reference numerals in the figures, 10 indicates a light emitting device, 11 indicates a semiconductor light emitting element, 12 indicates a fluorescent material layer, 13 indicates a mount lead, 14 indicates an inner lead, 15 indicates a conductive wire, 16 indicates a conductive wire, 17 indicates a sealing resin portion, 18 indicates a bracket, and 19 indicates an electric contact.

BEST MODE FOR CARRYING OUT THE INVENTION

The light emitting device to which this embodiment is applied is illustrated below, but the following illustration is one example (typical example) of embodiments, and the device is not specified by these contents.

FIG. 1 is a view for illustrating the light emitting device in this embodiment. The light emitting device 10 shown in FIG. 1 comprises a bracket 18, a mount lead 13 and an inner lead 14 which are attached to the bracket 18, an electric contact 19 which is attached to a lower portion of the bracket 18 and conductive to the mount lead 13 and the inner lead 14, a semiconductor light emitting element 11 housed in a cup of an upper portion of the mount lead 13, a fluorescent material layer 12 in which a red fluorescent material is mixed and dispersed in a binder resin, and which is provided so as to cover the semiconductor light emitting element 11, a conductive wire 15 which makes the inner lead 14 and the semiconductor light emitting element 11 conductive to each other, a conductive wire 16 which makes the semiconductor light emitting element 11 and the mount lead 13 conductive to each other, and a sealing resin portion 17 which is formed on an upper portion of the bracket 18 in a dome form and seals these semiconductor light emitting element 11, fluorescent material layer 12, mount lead 13, inner lead 14, conductive wire 15 and conductive wire 16.

The semiconductor light emitting element 11 emits light within the region from near-ultraviolet light to visible light, and a fluorescent material contained in the fluorescent material layer 12 absorbs this light to emit visible light having a longer wavelength. As the semiconductor light emitting element 11, there is used a laser diode (LD) or light emitting diode (LED) having a peak wavelength ranging from 360 nm to 470 nm in a light emission spectrum. Although such a laser diode (LD) or light emitting diode (LED) is not particularly limited, for example, an LD or LED having a peak wavelength of 380 nm to 470 nm, more preferably a peak wavelength in a longer visible light region than 400 nm is preferred. In the semiconductor light emitting element in which the peak wavelength is excessively on the short wavelength side, organic compounds such as a complex and a resin are liable to deteriorate by light. This is therefore unfavorable. On the other hand, when the peak wavelength is excessively on the long wavelength side, the triplet energy level of a ligand of a rare earth element ion complex decreases to narrow the range of choice for a light-emittable ligand. This is therefore unfavorable.

The flurecent material contained in the flurorescent material layer 12 contains a rare earth element ion complex having an aromatic ring-containing Bronsted acid ion with a pKa value of 7 or less as a ligand. Above all, a Bronsted acid ion represented by general formula (2) shown below, which is derived from an aromatic ring-containing Bronsted acid represented by general formula (1) shown below, is preferably used as the ligand:

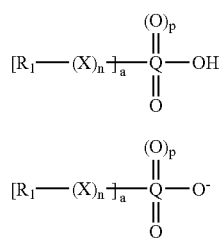

wherein $R_1$ is a group containing at least one aromatic hydrocarbon ring or aromatic heterocycle, each optionally having a substituent group, X is a divalent connecting group, Q represents a carbon, sulfur or phosphorous atom, a represents 1 or 2, n represents 0 or 1, and p represents 0 or 1.

The Bronsted acid represented by general formula (1) is converted to the Bronsted acid ion represented by general formula (2) by dissociation of a proton ($H^+$) from an OH group.

Typical examples of the aromatic ring-containing Bronsted acid with a $pK_a$ value of 7 or less are a carboxylic acid, a sulfonic acid, a sulfinic acid and a phosphinic acid. In general formula (1), when Q is a carbon atom, a=1 and p=0, thus resulting in a carboxylic acid. When Q is a sulfur atom, a=1, resulting in a sulfinic acid in the case of p=0, and a sulfonic acid in the case of p=1. When Q is a phosphorus atom, a=2 and p=0, resulting in a phosphonic acid.

Of these, the carboxylic acid and the sulfonic acid are preferred in terms of the degree of freedom of synthesis and stability. The carboxylic acid has a feature that a complex having high luminescence intensity is easily obtained, and the sulfonic acid has a feature that a complex in which the excitation wavelength is made longer is easily obtained.

Further, the ligand represented by general formula (2) contains at least one aromatic ring, and has 8 or more π electrons. It is preferred in terms of an absorption wavelength region that a Bronsted acid ion constituting a π-conjugated system is used as the ligand. Furthermore, the number of the aromatic rings is not particularly limited, as long as the triplet energy of a mother compound of the Bronsted acid ion is higher than the excited-state energy level of the rare earth element ion. In the case of a europium ion complex or a terbium ion complex, it is usually preferred to use a tricyclic or less cyclic aromatic ring or aromatic heterocycle as the aromatic ring. When the number of condensed aromatic rings is 4 or more, for example, in a compound having four aromatic rings such as pyrene, the triplet energy excited by absorbing light from the semiconductor light emitting element 11 decreases, so that there is the possibility that the rare earth element ion complex becomes impossible to emit light.

$R_1$ in general formula (2) is preferably a monovalent group derived from a tricyclic or less cyclic aromatic hydrocarbon ring or aromatic heterocyclic ring, each optionally having a substituent group. The aromatic hydrocarbon rings include, for example, aromatic monocyclic hydrocarbons or aromatic condensed polycyclic hydrocarbons such as benzene, naphthalene, indene, biphenyl, acenaphthene, fluorene, phenanthrene, tetralin, indan and indene; compounds derived from aromatic hydrocarbons such as benzoquinone, naphthoquinone and anthraquinone; and the like. The aromatic heterocyclic rings include aromatic monocyclic heterocycles or aromatic condensed polycyclic heterocycles such as furan, pyrrole, thiophene, oxazole, isoxazole, thiazole, imidazole, pyridine, benzofuran, benzothiophene, coumarin, benzopyran, carbazole, xanthene, quinoline, triazine, dibenzofuran, dibenzothiophene, chroman, pyrazoline, pyrazolone and flavone; and the like Further, the substituent groups which $R_1$ optionally has include an alkyl group such as methyl, ethyl, propyl or butyl; a fluoroalkyl group such as trifluoromethyl or pentafluoroethyl; a cycloalkyl group such as a cyclohexyl group; an ethynyl group; an arylethynyl group such as phenylethynyl, pyridylethynyl or thienylethynyl; an alkoxy group such as methoxy or ethoxy; an aryl group such as phenyl or naphthyl; an aralkyl group such as benzyl or phenethyl; an aryloxy group such as phenoxy, naphthoxy or biphenyloxy; a hydroxyl group; an allyl group; an acyl group such as acetyl, propionyl, benzoyl, toluoyl or biphenylcarbonyl; an acyloxy group such as acetoxy, propionyloxy or benzoyloxy; an alkoxycarbonyl group such as methoxycarbonyl or ethoxycarbonyl; an aryloxycarbonyl group such as phenoxycarbonyl; a carboxyl group; a carbamoyl group; an amino group; a substituted amino group such as dimethylamino, diethylamino, methylbenzylamino, diphenylamino or acetylmethylamino; a substituted thio group such as methylthio, ethylthio, phenylthio or benzylthio; a mercapto group; a substituted sulfonyl group such as ethylsulfonyl or phenylsulfonyl; a cyano group; a halogen group such as fluoro, chloro, bromo or iodo; and the like.

Of these, preferred are an alkyl group having 1 to 4 carbon atoms, an alkoxy group, an aryl group, a cycloalkyl group, an aryloxy group, an aralkyl group, an ethynyl group and a halogen group. $R_1$ is not limited to these substituent groups. These substituent groups may further have a substituent group.

Then, the Bronsted acid ion represented by general formula (2) is divided into the case where it does not have X as a divalent connecting group (n=0) and the case where it has X (n=1). Further, when it has X as a divalent connecting group (n=1), X is divided into two types of forms, the case where it has a carbonyl group and the case where it has no carbonyl group. Accordingly, the Bronsted acid ion represented by general formula (2) is further represented by general formula (3) shown below having no carbonyl group and general formula (4) shown below having a carbonyl group. As the rare earth element ion complex, there can be used any of complex structures in which these Bronsted acid ions are used as the ligands.

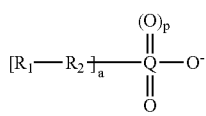

(3)

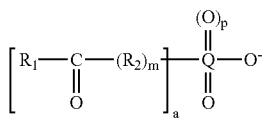

(4)

In general formula (3) and general formula (4), $R_2$ may be any, as long as it acts as a divalent connecting group. Examples thereof include an alkylene group, a divalent connecting group derived from a ring-assembled hydrocarbon and a divalent connecting group derived from an aliphatic ring, an aromatic ring or a heterocycle, and the like. In general formula (4), m is 0 or 1.

The alkylene groups of $R_2$ include methylene, ethylene and the like. The ring-assembled hydrocarbons include biphenyl, terphenyl, binaphthyl, cyclohexylbenzene, phenylnaphthalene and the like. The aliphatic rings include cyclopentane, cyclohexane, cycloheptane, norbornane, bicyclohexyl and the like. The aromatic rings include the same compounds as the specific examples of the aromatic rings described above. The heterocycles include, as well as the aromatic heterocycles described above, aliphatic heterocycles such as pyrazoline, piperazine, imidazolidine and morpholine. In addition, $R_2$ includes thioalkylenes such as —SCH$_2$—; oxyalkylenes such as —OCH$_2$— and —OCH$_2$CH$_2$—; vinylene (—C═C—); and the like. $R_2$ is not limited to these divalent substituent groups, but a conjugated system-forming group such as an aromatic ring is preferred, and a phenylene group and a naphthylene group is particularly preferred. These divalent substituent groups may further have a substituent group.

Of the Bronsted acids represented by general formula (1), when Q is a carbon atom and p is 1, that is, specific examples of the carboxylic acids from which the carboxylic acid ion is derived are exemplified below. The carboxylic acid used in this embodiment is not limited thereto. In general formula (1), when n is 0, compounds include the following carboxylic acids (1 to 10):

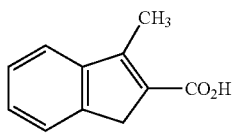

1

-continued

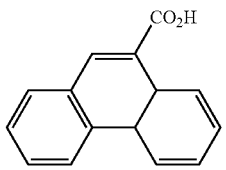

2

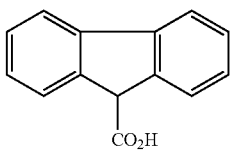

3

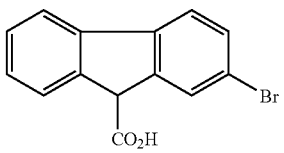

4

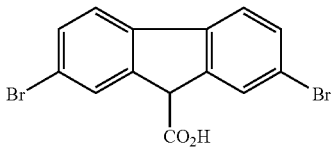

5

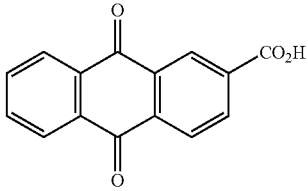

6

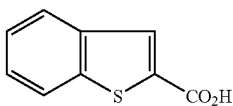

7

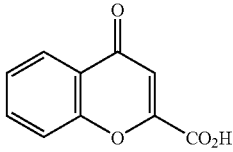

8

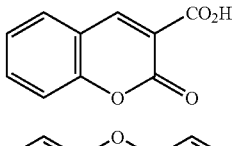

9

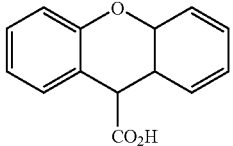

10

Next, in general formula (1), when n is 1 and X is $R_2$ (general formula (3)), compounds include the following carboxylic acids (11 to 15 and A-1 to A-3):

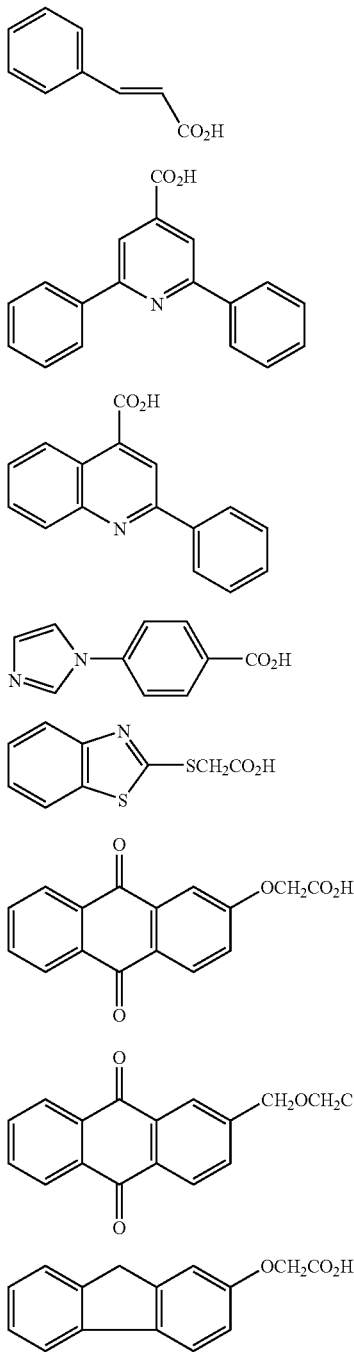
Then, in general formula (4), when m is 0, compounds include the following carboxylic acids (16, 17 and B-1 to B-5):
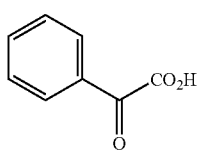
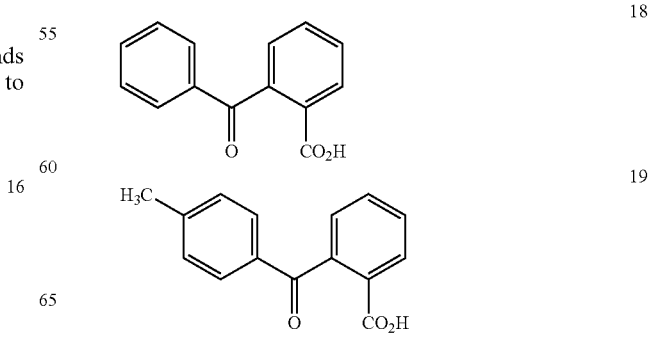
In general formula (4), when m is 1, $R_1$ is a phenyl group and $R_2$ is a phenylene group, compounds include the following carboxylic acids (18 to 30, C-1 and C-2):

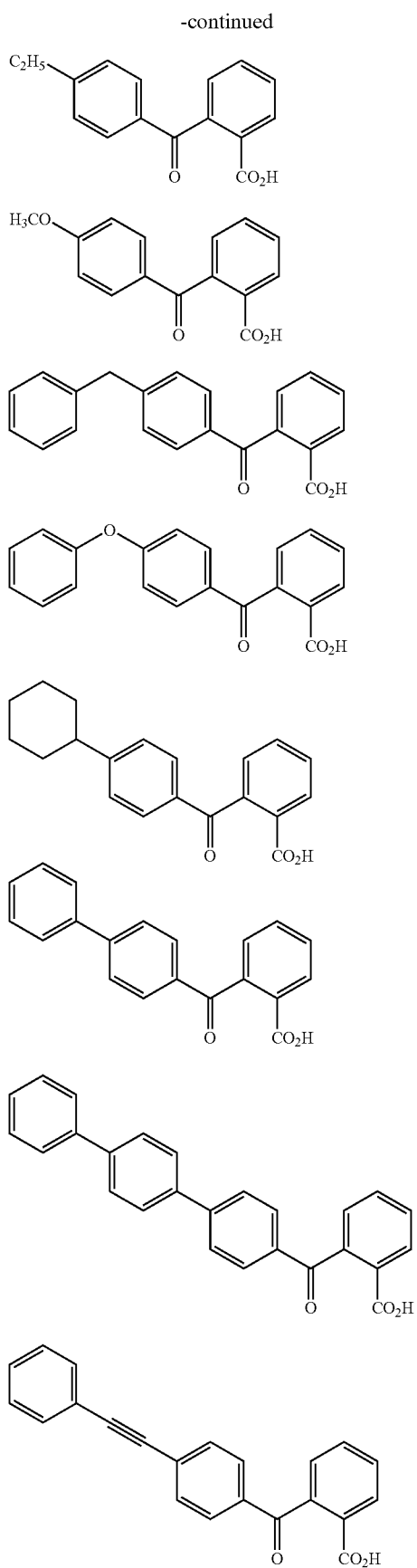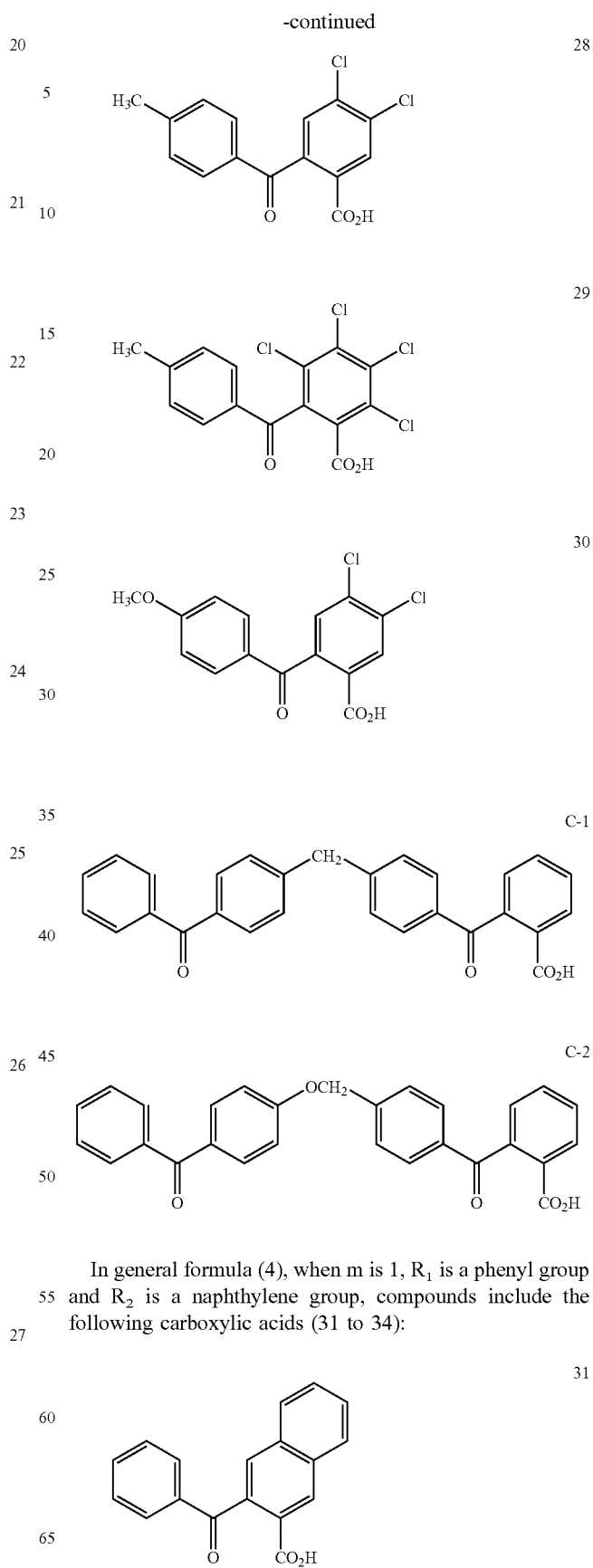
In general formula (4), when m is 1, $R_1$ is a phenyl group and $R_2$ is a naphthylene group, compounds include the following carboxylic acids (31 to 34):

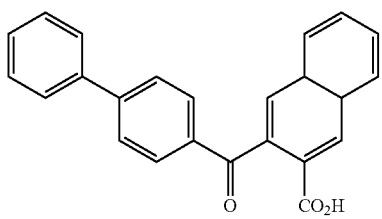
32
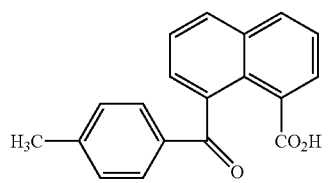
33
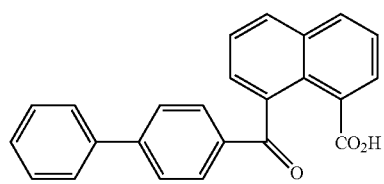
34
In general formula (4), when m is 1, $R_1$ is a phenyl group and $R_2$ is another group, compounds include the following carboxylic acids (35 to 37 and D-1 to D-3):
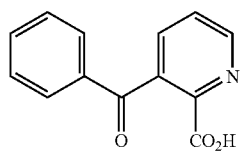
35
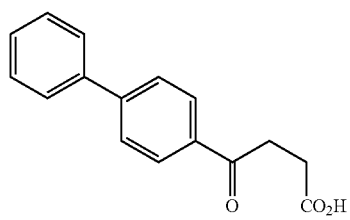
36
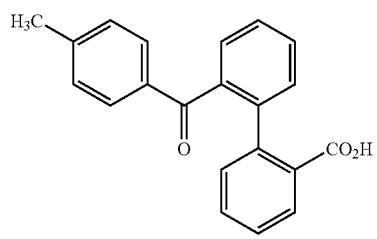
37
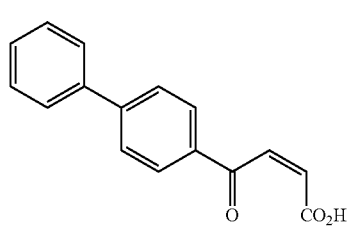
D-1
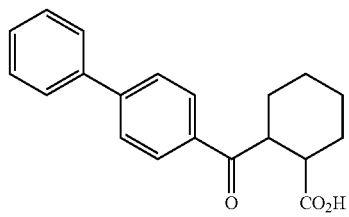
D-2
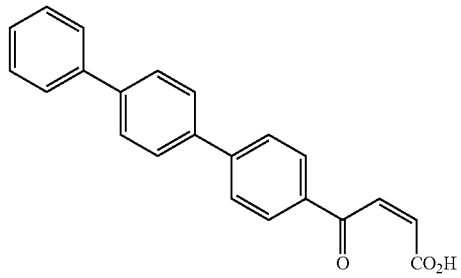
D-3
In general formula (4), when m is 1, $R_1$ is a naphthyl group and $R_2$ is an aromatic hydrocarbon ring, compounds include the following carboxylic acids (38 to 41, E-1 and E-2):
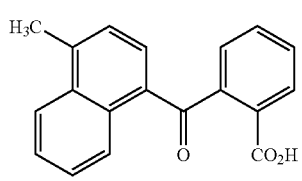
38
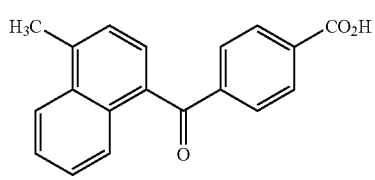
39
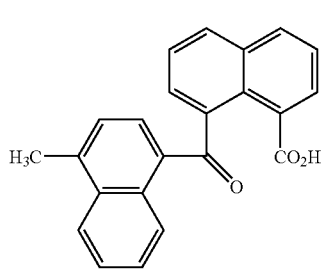
40
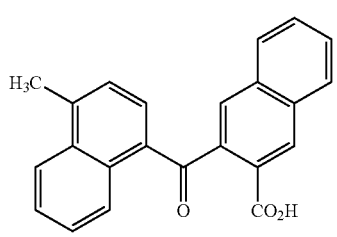
41

-continued

E-1
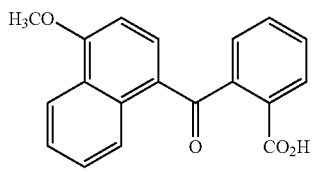

E-2
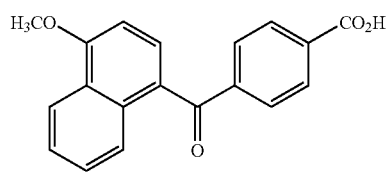

In general formula (4), when m is 1, $R_1$ is a naphthyl group and $R_2$ is another group, compounds include the following carboxylic acids (42 to 44 and F-1):

42
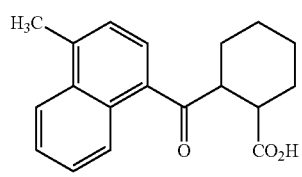

43
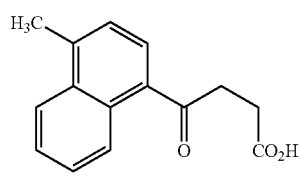

44
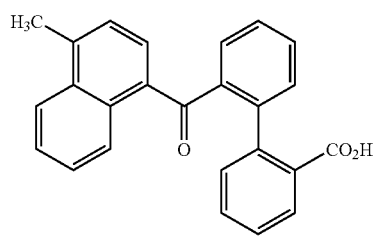

F-1

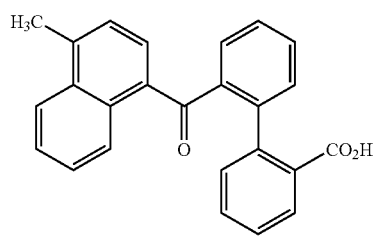

In general formula (4), when m is 1, $R_1$ is an acenaphthyl group and $R_2$ is a phenylene group or another group, compounds include the following carboxylic acids 45 to 48 and G-1):

45
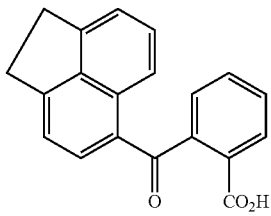

46
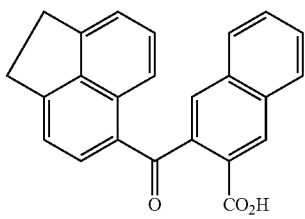

47
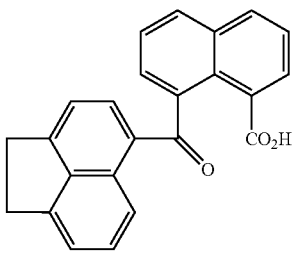

48
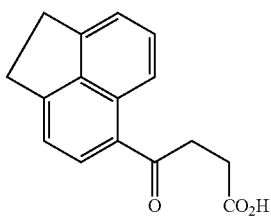

G-1
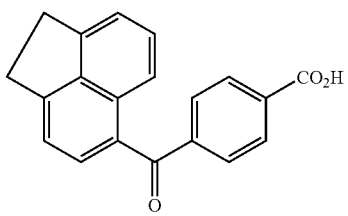

In general formula (4), when m is 1, $R_1$ is a fluorenyl group and $R_2$ is a phenylene group, compounds include the following carboxylic acids (50 to 55 and H-1 to H-9):

50
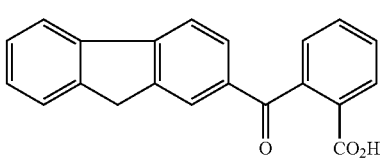

51
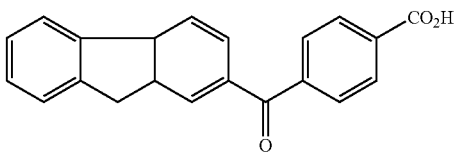

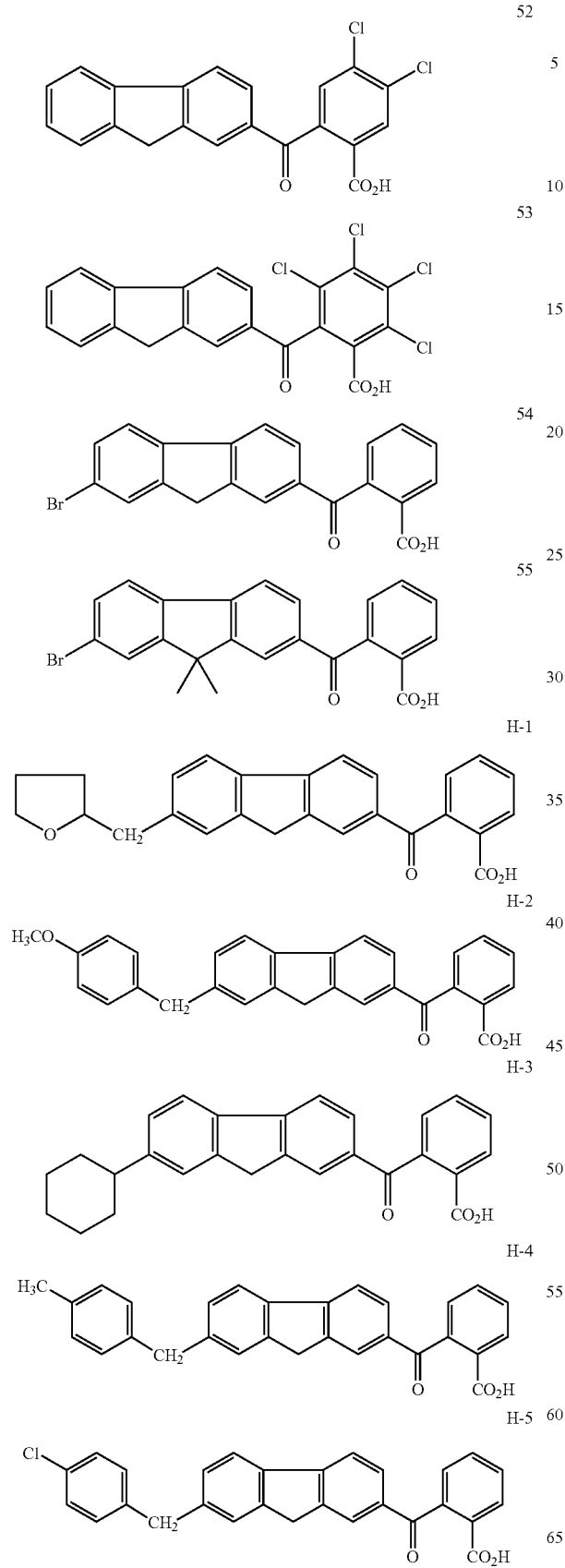
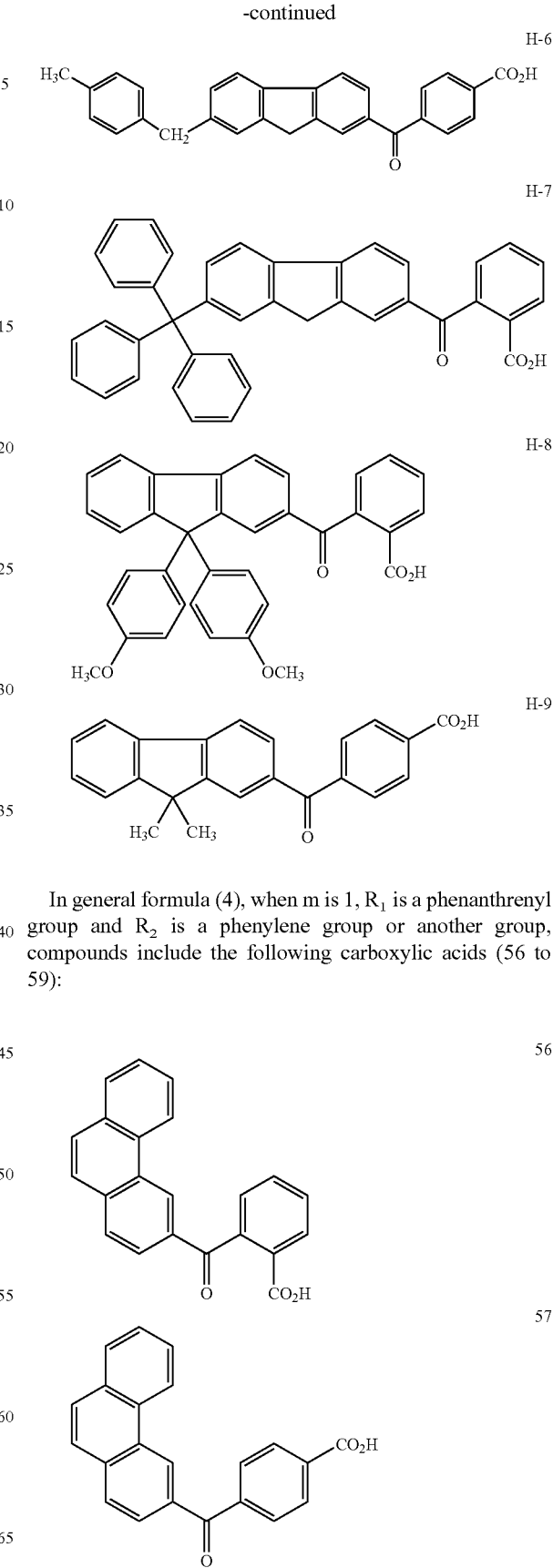
In general formula (4), when m is 1, $R_1$ is a phenanthrenyl group and $R_2$ is a phenylene group or another group, compounds include the following carboxylic acids (56 to 59):

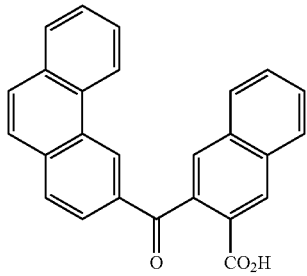
58
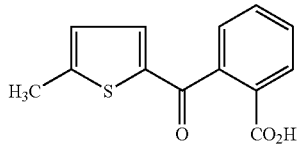
59
In general formula (4), when m is 1, $R_1$ is a heterocyclic group and $R_2$ is a phenylene group, compounds include the following carboxylic acids (60, 61 and I-1 to I-21):
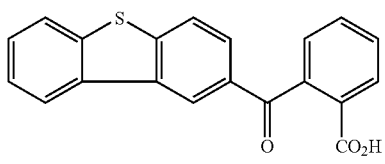
60
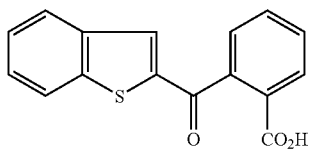
61
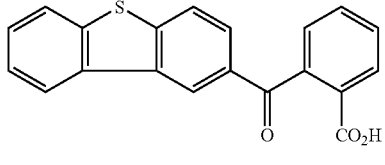
I-1
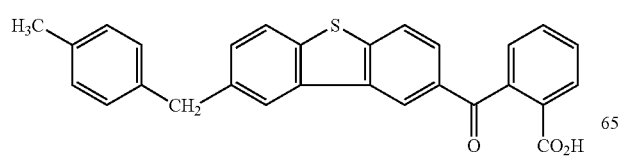
I-3
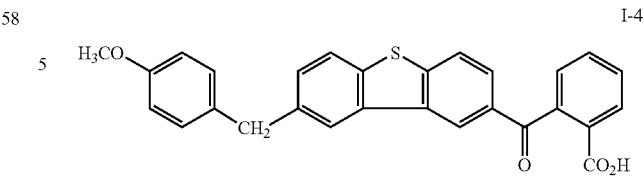
I-4
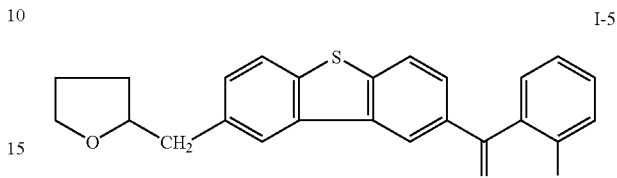
I-5
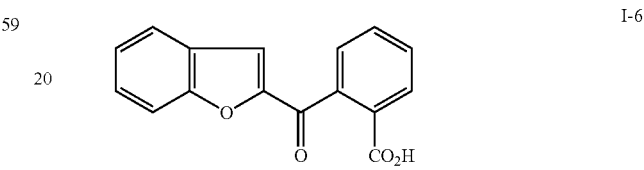
I-6
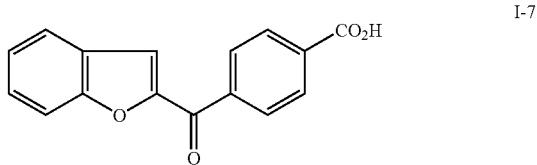
I-7
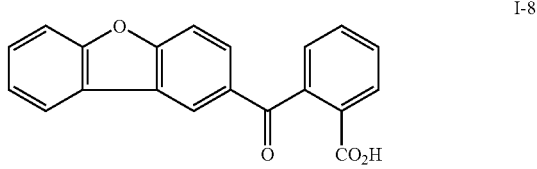
I-8
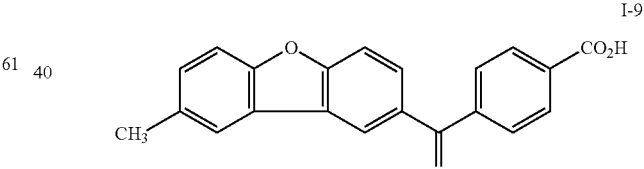
I-9
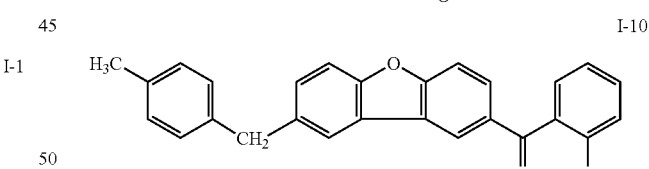
I-10
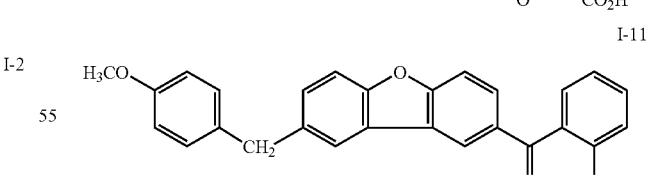
I-11
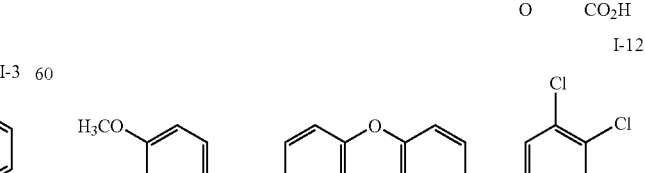
I-12

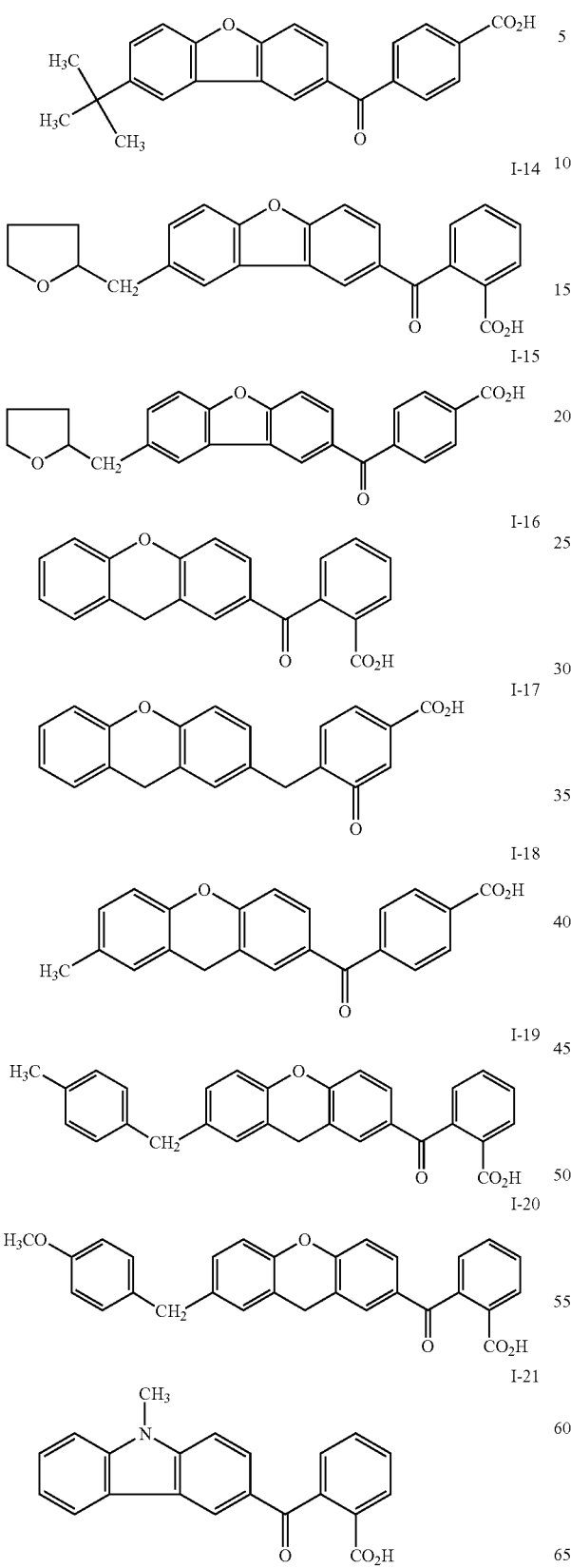

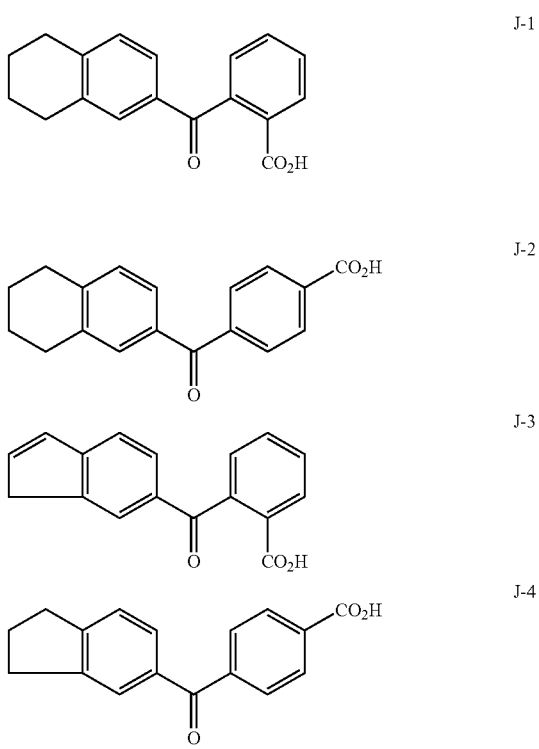

In general formula (4), when m is 1, $R_1$ is another group and $R_2$ is a phenylene group, compounds include the following carboxylic acids (J-1 to J-4):

The carboxylic acid from which the carboxylic acid ion is derived can be synthesized by known methods. Synthesis methods are described, for example, in *Shin-Jikken Kagaku Koza* (New Course for Experimental Chemistry), Vol. 14, "Synthesis and Reaction of Organic Compounds (II)", page 921, edited by The Chemical Society of Japan (1977), *Jikken Kagaku Koza* (Course for Experimental Chemistry), 4th Ed., Vol. 22, "Organic Synthesis", page 1, edited by The Chemical Society of Japan (1992) or the like. Typical examples of the synthesis methods include an oxidation reaction of a corresponding primary alcohol or aldehyde, a hydrolysis reaction of an ester or a nitrile, a Friedel-Craft reaction by an acid anhydride, and the like.

In particular, according to the Friedel-Craft reaction using phthalic anhydride, naphthalic anhydride, succinic anhydride, diphenic anhydride, 1,2-cyclohexanedicarboxylic acid anhydride, 2,3-pyridazinecarboxylic acid anhydride or the like, a carboxylic acid having a carbonyl group in its molecule can be synthesized. For example, according to the Friedel-Craft reaction using an aromatic hydrocarbon or an aromatic heterocycle and phthalic anhydride, a carboxylic acid in which a carbonyl group is bonded to the ortho-position of a benzene ring can be easily synthesized, as shown in the reaction formula below. The carboxylic acid in which a carbonyl group is bonded to the ortho-position of a benzene ring is preferred, because a complex having high luminance is easily obtained compared to the para-substituted one.

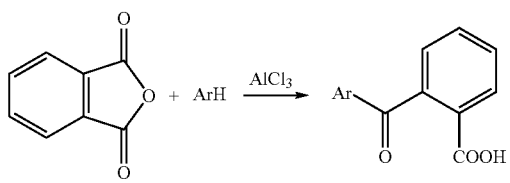

Of the Bronsted acids represented by general formula (1), when Q is a sulfur atom and p=1, that is, specific examples of the sulfonic acids from which the sulfonic acid ion is derived are exemplified below. The sulfonic acid used in this embodiment is not limited thereto. In general formula (1), when n is 0, compounds include the following sulfonic acids (K-1 to K-6):

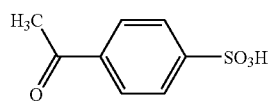

K-1

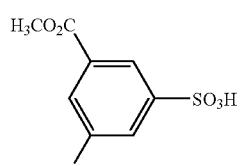

K-2

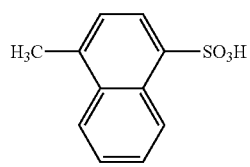

K-3

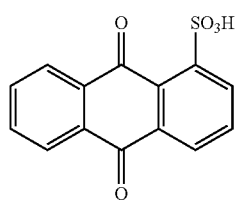

K-4

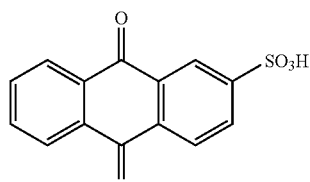

K-5

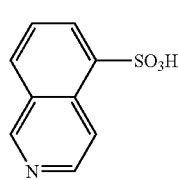

K-6

Next, in general formula (1), when n is 1 and X is $R_2$ (general formula (3)), compounds include the following sulfonic acids (L-1 to L-3):

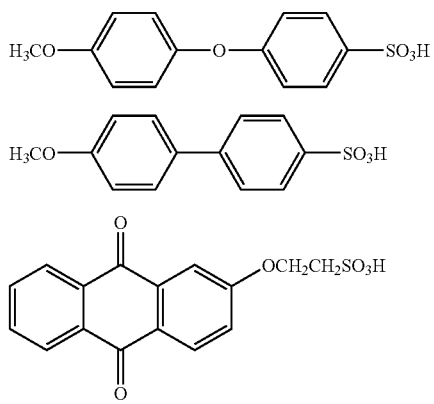

L-1

L-2

L-3

Then, in general formula (4), when m is 1, $R_1$ is a phenyl group and $R_2$ is an aromatic hydrocarbon ring, compounds include the following sulfonic acid (M-1):

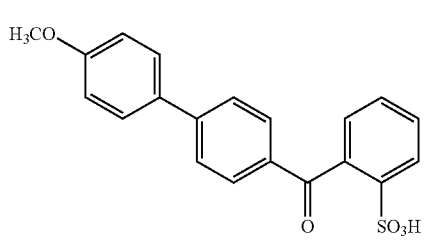

M-1

Then, in general formula (4), when m is 1, $R_1$ is a fluorenyl group and $R_2$ is a phenylene group or another group, compounds include the following sulfonic acids (N-1 and N-2):

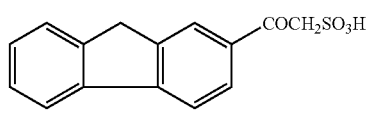

N-1

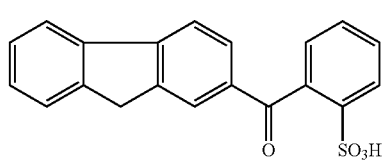

N-2

In general formula (4), when m is 1, $R_1$ is a heterocyclic group and $R_2$ is a phenylene group or another group, compounds include the following sulfonic acids (O-1 to O-6):

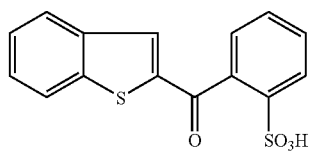

O-1

-continued

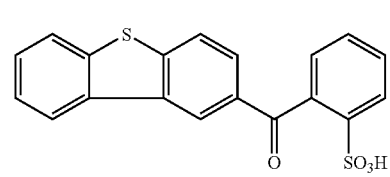
0-2

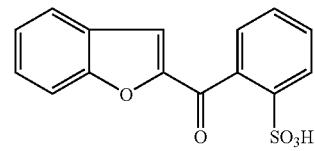
0-3

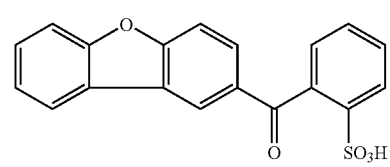
0-4

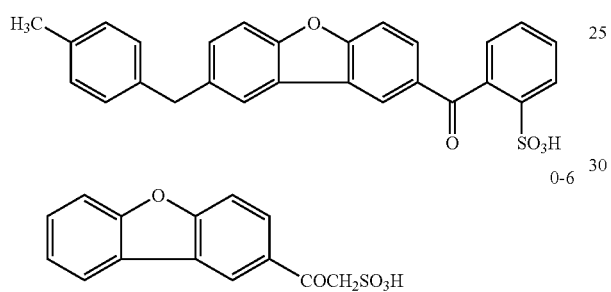
0-5

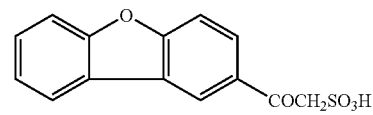
0-6

Synthesis methods of the sulfonic acid are described, for example, in *Shin-Jikken Kagaku Koza* (New Course for Experimental Chemistry), Vol. 14, "Synthesis and Reaction of Organic Compounds [III]", page 1773, edited by The Chemical Society of Japan, published by Maruzen Co., Ltd. (1978), and the like. Typical examples of the synthesis methods of the aromatic sulfonic acid include a sulfonation reaction by fuming sulfuric acid, and a hydrolysis method of sulfonyl chloride synthesized by chlorosulfonic acid. In addition, the sulfonic acid can also be synthesized by a Friedel-Craft reaction using 2-sulfobenzoic acid anhydride as shown by the following formula:

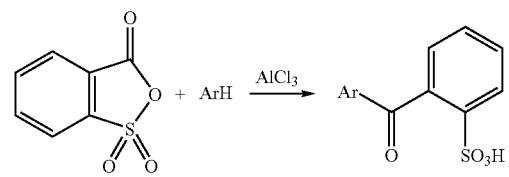

Of the Bronsted acids represented by general formula (1), when Q is a sulfur atom and p=0, that is, specific examples of the sulfinic acids from which the sulfinic acid ion is derived are exemplified below. The sulfinic acid used in this embodiment is not limited thereto. In general formula (1), when n is 0, compounds include the following sulfinic acids (P-1 to P-6):

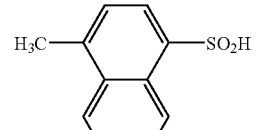
P-1

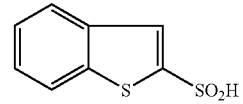
P-2

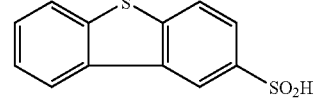
P-3

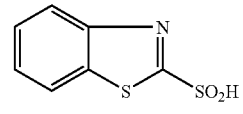
P-4

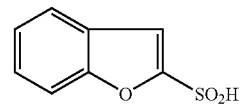
P-5

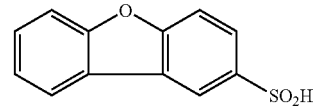
P-6

Next, in general formula (1), when n is 1 and X is $R_2$ (general formula (3)), compounds include the following sulfinic acids (Q-1 to Q-5):

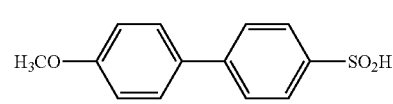
Q-1

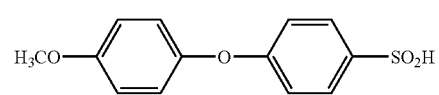
Q-2

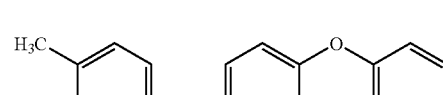
Q-3

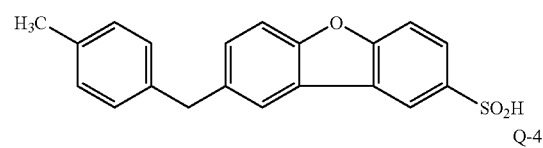
Q-4

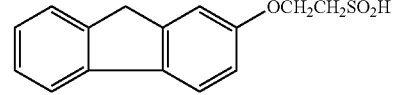
Q-5

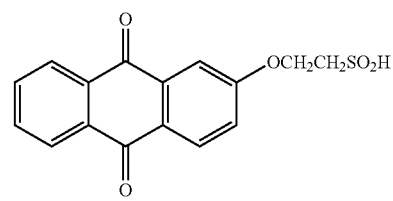

In general formula (4), when m is 1, $R_1$ is a phenyl group and $R_2$ is a phenylene group, compounds include the following sulfinic acids (R-1 and R-2):

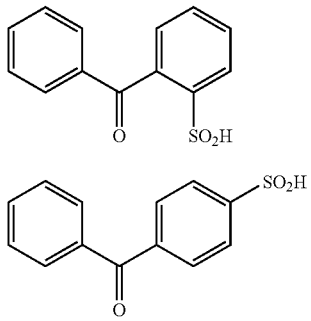

Of the Bronsted acids represented by general formula (1), when Q is a phosphorus atom and p=0, that is, specific examples of the phosphinic acids from which the phosphinic acid ion is derived are exemplified below. The phosphinic acid used in this embodiment is not limited thereto. In general formula (1), when n is 0, compounds include the following phosphinic acids (S-1 and S-2):

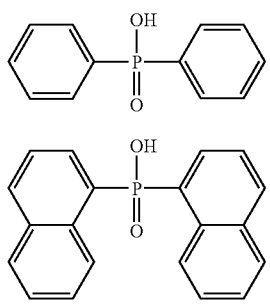

Next, in general formula (1), when n is 1 and X is $R_2$ (general formula (3)), compounds include the following phosphinic acid (T-1):

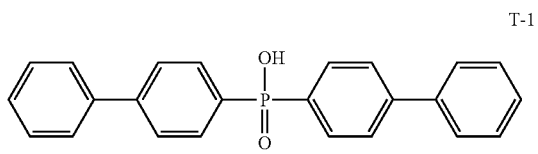

In the light emitting device 10 to which this embodiment is applied, the fluorescent material contained in the fluorescent material layer 12 containing the rare earth element ion complex having the specific aromatic group-containing Bronsted acid ion as the ligand absorbs light from the semiconductor light emitting element 11 and emits visible light having a longer wavelength, as described above. As the mechanism of light emission of the rare earth element ion complex, there is known the mechanism that the ligand absorbs light from the light emitter and excitation energy thereof transfers to the rare earth element ion complex to excite it, thereby emitting light. When the excitation energy level of the ligand is too low, energy transfer does not occur, resulting in failure to emit light. For example, in the case of europium, this mechanism is illustrated with reference to FIG. 2.

Figure 2:
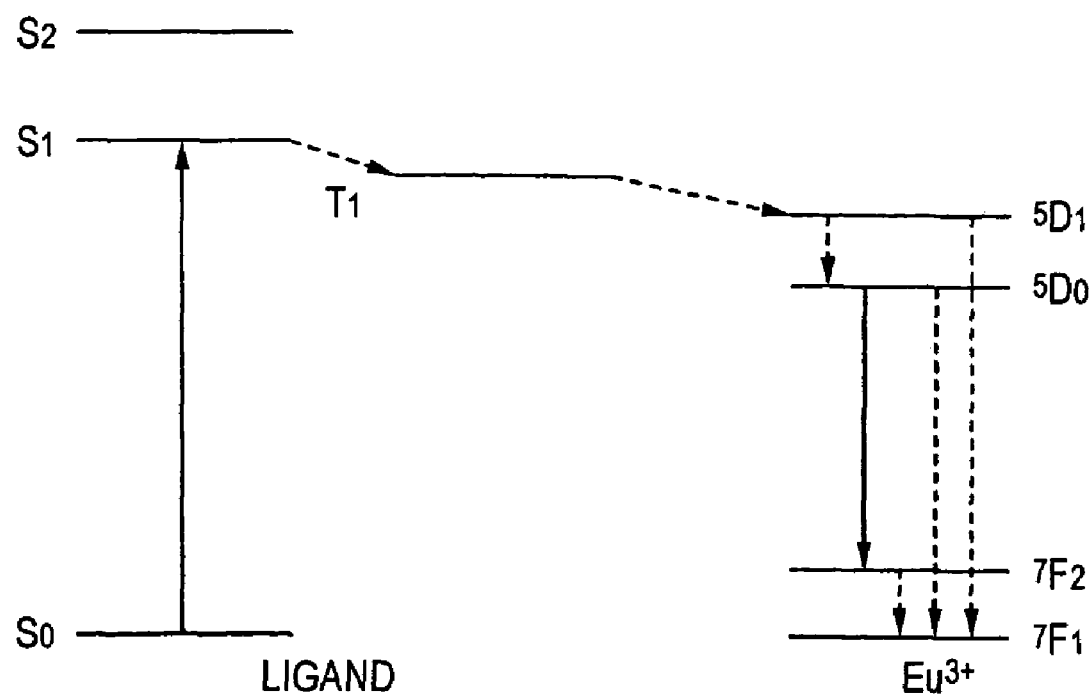
FIG. 2 is a view for illustrating a light emitting mechanism of a Eu complex for a red fluorescent material.

That is, as shown in FIG. 2, the ligand goes into an excited singlet (S1) state on absorption of light, and intersystem crossing is carried out therefrom to an excited triplet ($T_1$) state. Then, energy transfer is performed from the $T_1$ state to an excited state of the rare earth element ion. In this case, the transfer of energy higher than an excited-state level of a light emission level is required. In the case of energy lower than the light emission level, light emission does not occur as a matter of course. The rare earth ion excited by energy transfer emits light by transition from a light emission level high in transition probability to a base state. In a europium ion ($Eu^{3+}$), it has been considered that transition from $^5D_0$ to $^7F_2$ causes light emission of a red color which is a main component. In a terbium ion ($Tb^{3+}$), light emission of a green color from a light emission level $^5D_4$ occurs. Light emission spectra of these trivalent rare earth ions are described in the following literature (*Kidorui no Kagaku* (Science of Rare Earths), written and edited by Ginya Adachi, page 154, Kagaku Dojin (1999)). Further, the effect of energy of the triplet state in the mechanism of energy transfer has been reported in studies in which the triplet energy ($T_1$) of a ligand molecule and light emission of a Eu complex are measured and the relationship therebetween is discussed (for example, *Bulletin of The Chemical Society of Japan*, Vol. 43, 1955-1962 (1970) etc.)

In the light emitting device 10 to which this embodiment is applied, it is desirable that the $T_1$ level of the aromatic ring-containing Bronsted acid used as the ligand of the rare earth element ion complex has energy higher than the excited-state level of the rare earth element ion. As a result of studies of various Bronsted acids, in the Bronsted acid ion as the ligand for light emission of the rare earth element ion complex, it is necessary that at least the triplet energy of the mother compound of the Bronsted acid ion has a higher value than the excited-state energy level of the rare earth element ion.

Further, for example, in the case of an ion derived from coumarin carboxylic acid as the ligand of the europium complex, the triplet energy of coumarin carboxylic acid is 255 kJ/mol, the triplet energy of coumarin which is a mother compound thereof is 258 kJ/mol, and the difference therebetween is 3 kJ/mol. It is therefore preferred that the triplet energy of the mother compound is 3 kJ/mol or more higher than the excited-state energy level of the europium ion.

The $^5D_1$ level of the $Eu^{3+}$ ion is reported to be 19,100 $cm^{-1}$ (228.5 kJ/mol) (*Chemical Review*, Vol. 82, pages 541-552 (1982)), and it has been confirmed that the Eu complex having the Bronsted acid ion of anthracene (176 kJ/mol) or pyrene (202 kJ/mol), which has a triplet energy lower than this, as the ligand does not emit light. The triplet energy can be measured from a phosphorescence spectrum of a solution. Data books in which triplet energy values of compounds are collected can be consulted. Tables in which data are collected include, for example, *Hikari to Kagaku no Jiten* (A Dictionary of Light and Chemistry), edited by Editorial Board of Hikari to Kagaku no Jiten, pages 550-605, Maruzen Co., Ltd. (2002), and the like.

As the rare earth element ion complex contained in the fluorescent material contained in the fluorescent material layer 12, there is generally used, from the viewpoint of luminance, a rare earth element ion complex represented by general formula (5), which has two Lewis base compounds as an auxiliary ligand based on one rare earth element ion:

$$A_3LD_r \qquad (5)$$

wherein A represents the Bronsted acid ion of the above-mentioned general formula (2) which may be different from one another, L represents a rare earth element ion, D represents an auxiliary ligand comprising a Lewis base, and r represents 0, 1 or 2.

Although the Lewis base compound (D) used as the auxiliary ligand is not particularly limited, it is usually selected from Lewis base compounds having a nitrogen atom or oxygen atom which can coordinate to the rare earth element ion. Examples thereof include an amine, an amine oxide, a phosphine oxide and a sulfoxide, each optionally having a substituent group, and the like. The two Lewis base compounds used as the auxiliary ligand may be compounds different from each other or the same compound.

For specific examples of the Lewis base compounds (D) used as the auxiliary ligand, for example, the amines include pyridine, pyrazine, quinoline, isoquinoline, phenanthridine, 2,2'-bipyridine, 1,10-phenanthroline and the like. The amine oxides include N-oxides of the above-mentioned amines such as pyridine-N-oxide and 2,2'-bipyridine-N,N'-dioxide. The phosphine oxides include triphenylphosphine oxide, trimethylphosphine oxide, trioctylphosphine oxide and the like. The sulfoxides include diphenyl sulfoxide, dioctyl sulfoxide and the like.

Of these Lewis base compounds, when there exist two coordinated atoms in a molecule, for example, two nitrogen atoms or the like, such as bipyridine and phenanthroline, one Lewis base compound may be allowed to act as two auxiliary ligands. As the substituent groups to be substituted to these Lewis base compounds, there are exemplified the substituent groups described above. Above all, particularly preferred are an alkyl group, an aryl group, an alkoxyl group, an aralkyl group, an aryloxy group, a halogen group and the like.

Specific examples (1 to 23) of the Lewis base compounds (D) used as the auxiliary ligand are exemplified below. However, the Lewis base compounds used in this embodiment should not be construed as being limited thereto.

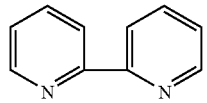

1

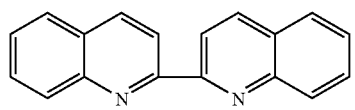

2

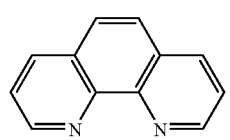

3

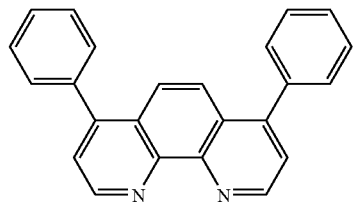

4

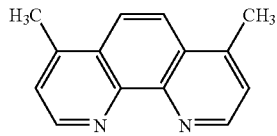

5

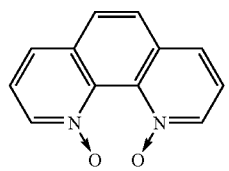

6

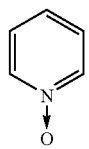

7

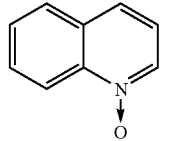

8

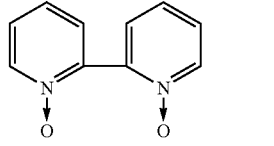

9

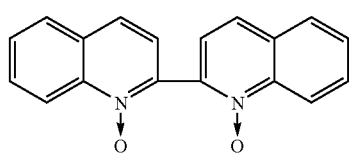

10

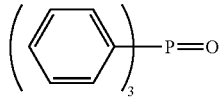

11

$(CH_3{\overline{)_3}}P{=}O$

12

$(C_8H_{17}{\overline{)_3}}P{=}O$

13

$(C_6H_{13}{\overline{)_3}}P{=}O$

14

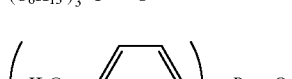

15

$(C_8F_{17}{\overline{)_3}}P{=}O$

16

-continued

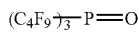     (17)

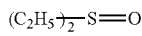     (18)

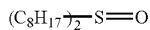     (19)

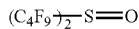     (20)

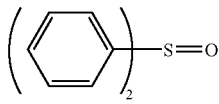     (21)

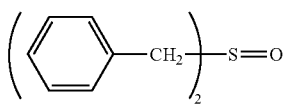     (22)

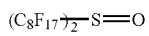     (23)

When the rare earth element ion complex of the present invention is produced, it sometimes happens that crystallization is difficult, or that the auxiliary ligand is not incorporated, depending on the kind of Bronsted acid of a raw material. Accordingly, different kinds of Bronsted acids such as those having different substituent groups may be used as a mixture.

The Bronsted acid to be mixed may be a Bronsted acid having no aromatic ring, but the aromatic ring-containing Bronsted acid represented by the above-mentioned general formula (1) is preferred. In this case, the mixture may be either a mixture of Bronsted acids of the same kind such as carboxylic acids or sulfonic acids, or a mixture of different kinds of Bronsted acids such as a combination of a carboxylic acid and a sulfonic acid.

The rare earth element ion complex of the present invention can be easily synthesized by mixing a solution of a rare earth element halide or the like with a solution containing the above-mentioned Bronsted acid which acts as the ligand, a Lewis base which acts as the auxiliary ligand and a base.

As a solvent used in the ligand solution, there is used an alcohol such as methanol, ethanol or isopropanol. There is also available an organic solvent such as a ketone such as acetone or methyl ethyl ketone, an ether such as tetrahydrofuran or dimethoxyethane, dimethyl sulfoxide or dimethylformamide. When the acid is slightly soluble in an alcohol, a mixed solvent with these organic solvents is used.

As the base, there is used an amine such as triethylamine, triethanolamine, diethanolamine or piperidine, as well as an alkali hydroxide such as sodium hydroxide or potassium hydroxide. As a solvent for dissolving the salt of the rare earth element, there is used the above-mentioned alcohol, as well as water.

The complex is usually deposited as a precipitate immediately on mixing of the above-mentioned solution. The complex can be obtained by filtering and washing the deposited precipitate. When the resulting complex is recrystallized, a high-purity complex is obtained, impurities which inhibit light emission can be removed, and a crystalline complex having high luminous efficiency can be obtained. The precipitate deposited by the reaction is amorphous in some cases, and contains impurities in many cases. In order to increase luminous efficiency, a purification process is important. When the complex of the present invention is used as it is in a solid state, the luminous efficiency changes depending on the crystal form or the growth state of a crystal in many cases. Accordingly, treatment for obtaining the optimum crystal form or crystal growth state is also important. As the treatment methods, there can be used crystal form conversion treatment methods which are usually performed in organic pigments or crystals, such as heat treatment in an organic solvent, mechanical irritation and heat treatment, as well as the above-mentioned recrystallization.

The rare earth element complexes of the present invention form fluorescent materials of various luminescent colors by the rare earth element ions. The europium (Eu) complex forms a red fluorescent material, and the terbium (Tb) complex forms a green fluorescent material. In addition, a blue fluorescent material is obtained by a thulium (Tm) complex, yellow to orange fluorescent materials are obtained by respective fluorescent materials of holmium (Ho), erbium (Er), samarium (Sm) and dysprosium (Dy), and a red fluorescent material is obtained by a praseodymium (Pr) fluorescent material. The Bronsted acid ion which forms the ligand of each of these complexes is selected from acids having triplet energy higher than the excited-state energy level relating to light emission of the rare earth element ion.

The compounds specified in the present invention are usually solid in their state, and emit light by the action of light from the semiconductor light emitting element. The molecular weight thereof is usually from about 800 to 3,500.

In the light emitting device 10 to which this embodiment is applied, the fluorescent material layer 12 is prepared, for example, as a mixed resin composition obtained by dissolving or dispersing the europium complex-containing red fluorescent material in an appropriate binder resin, and arranged by coating or other methods at a position where light from the semiconductor light emitting element 11 is absorbed. Further, in the case of a cannonball form which is the general form of LEDs, the red fluorescent material can also be mixed in the sealing resin such as an epoxy resin. In this case, light from the red fluorescent material becomes light more diffused.

The resins used for preparing the mixed resin composition obtained by dissolving or dispersing the rare earth element ion complex-containing fluorescent material in the appropriate binder resin usually include a thermoplastic resin, a thermosetting resin, a photo-curing resin and the like. Specific examples thereof include a methacrylic resin such as polymethyl methacrylate; a styrenic resin such as polystyrene or a styrene-acrylonitrile copolymer; a polycarbonate resin; a polyester resin; a phenoxy resin; a butyral resin; polyvinyl alcohol; a cellulosic resin such as ethyl cellulose, cellulose acetate or cellulose acetate butyrate; an epoxy resin; a phenol resin; a silicone resin; and the like.

The light emitting device 10 to which this embodiment is applied further has another fluorescent material, for example, a fluorescent material containing rare earth element ion complexes different from each other, an inorganic fluorescent material or the like, in addition to the rare earth element ion complex exemplified in this embodiment. Specifically, it further has a blue fluorescent material and a green fluorescent material, together with the europium complex-containing red fluorescent material, and a combination of these makes it possible to emit white light. As the blue fluorescent material or the green fluorescent material, there can be used a known fluorescent material.

For example, the blue fluorescent materials include an organic fluorescent material comprising a fluorescent dye such as a naphthalic acid imide-based, a benzoxazole-based, a styryl-based, a coumarin-based, a pyrazoline-based or a triazole-based one, or an inorganic fluorescent material such as ZnS:Ag, $Sr_5(PO_4)_3Cl$:Eu or $BaMgAl_{10}O_{17}$:Eu. Further, the green fluorescent materials include an organic fluorescent material comprising a benzoxazinone-based, a quinazolinone-based, a coumarin-based, a quinophthalone-based or a naphthalic acid imide-based one, or an inorganic fluorescent material such as ZnS:Cu, ZnS:CuAl, $BaMgAl_{10}O_{17}$:Eu or Mn. In addition, the blue fluorescent materials include an organic fluorescent material such as a thulium complex, and the green fluorescent materials include an organic fluorescent material such as a terbium complex. As the ligands of these complexes, there can be used aromatic group-containing Bronsted acid ions used as the ligands of complexes in this embodiment, as well as the known ligands.

White light is emitted by arranging a fluorescent material resin layer containing a mixture of a red fluorescent material, a blue fluorescent material and a green fluorescent material on the semiconductor light emitting element 11. In this case, the red fluorescent material, the blue fluorescent material and the green fluorescent material are not necessarily mixed in the same resin, and a resin layer containing the red fluorescent material may be laminated on a resin layer containing the blue fluorescent material and the green fluorescent material.

Further, when the semiconductor light emitting element is a blue light emitting element, for example, a fluorescent material resin layer containing a mixture of the rare earth element ion complex of the present invention which emits red light and a green fluorescent material is arranged on the semiconductor light emitting element 11.

The light emitting devices 10 to which this embodiment is applied can be used alone or as a combination of the plurality of them, for example, as various lighting systems such as a lighting lamp, a back light for a liquid crystal panel or the like and ultrathin type illumination, and display units. Further, the rare earth element ion complex having the specific aromatic ring-containing Bronsted acid ion as the ligand, which is used in the light emitting device 10 to which this embodiment is applied, particularly, the europium complex having the carboxylic acid ion as the ligand has high light stability, compared to a conventional europium complex having a β-ketone as the ligand. As a result, the light emitting device 10 having durability is obtained.

EXAMPLES

This embodiment will be illustrated in greater detail with reference to the following examples, but this embodiment should not be construed as being limited thereto. Further, all the parts and percentages in the examples are given by weight unless otherwise specified.

(Light Stability Test of Red Fluorescent Material)

One part of a powder of a europium (Eu) complex and 200 parts of a dichloromethane solution (concentration: 20%) of polyvinyl butyral were mixed. The resulting mixed solution was applied onto a glass slide with a bar coater, and dried to prepare a resin layer having a film thickness of 20 μm. For this resin layer, a light stability test was performed using a light stability tester (Atlas Ci4000, manufactured by Toyo Seiki Seisaku-Sho Ltd.) under conditions of 58° C., a humidity of 50% and light emission for 2 hours to measure the residual ratio of a red fluorescent material. The larger numerical value indicates the better weather resistance (unit: %).

(Triplet Energy Values of Mother Compounds of Carboxylic Acid Ions)

The triplet energy values of the mother compounds ($R_1$—$(X)_n$—H) (1 to 12) of the mother compounds of the carboxylic acid ions represented by general formula (1) were obtained from the above-mentioned literature (*Hikari to Kagaku no Jiten* (A Dictionary of Light and Chemistry), edited by Editorial Board of Hikari to Kagaku no Jiten, pages 550-605, Maruzen Co., Ltd. (2002)), and are shown in Table 1.

TABLE 1

| | $R_1$—(X)n—H | Triplet Energy (kJ mof$^{-1}$) | $R_1$—(X)n—COOH | Eu Complex Emission |
|---|---|---|---|---|
| 1 | (structure) | 331 | (structure with COOH) | Observed |
| 2 | (structure) | 287 | (structure with CO₂H) | Observed |
| 3 | (structure) | 287 | (structure with COOH) | Observed |

TABLE 1-continued

| | $R_1$—(X)n—H | Triplet Energy (kJ mol$^{-1}$) | $R_1$—(X)n—COOH | Eu Complex Emission |
|---|---|---|---|---|
| 4 | 4-methylbenzophenone | 287 | 2-(4-methylbenzoyl)benzoic acid | Observed |
| 5 | fluorene | 282 | fluorene-9-carboxylic acid | Observed |
| 6 | anthraquinone | 261 | anthraquinone-2-carboxylic acid | Observed |
| 7 | phenanthrene | 260 | phenanthrene-9-carboxylic acid | Observed |
| 8 | styrene | 258 | cinnamic acid | Observed |
| 9 | coumarin | 258 | coumarin-3-carboxylic acid | Observed |
| 10 | fluorenone | 211 | fluorenone-1-carboxylic acid | Not observed |

TABLE 1-continued

| $R_1$—(X)n—H | | Triplet Energy (kJ mol$^{-1}$) | $R_1$—(X)n—COOH | Eu Complex Emission |
|---|---|---|---|---|
| 11 | 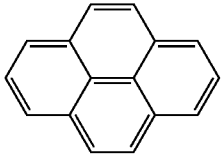 | 203 | 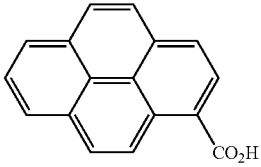 | Not observed |
| 12 | 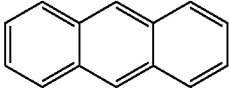 | 178 | 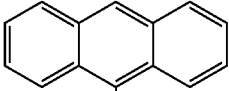 | Not observed |

Example 1

Using as raw materials carboxylic acids of 1 to 9 shown in Table 1 and phenanthroline as an auxiliary ligand, europium complexes were synthesized. For the nine kinds of europium complexes synthesized, the presence or absence of red light emission was measured by an LED emitting ultraviolet light of 375 nm. The results thereof are shown in Table 1.

From the results of Table 1, the triplet energies of the carboxylic acids of 1 to 9 were higher than the excited-state energy level of the europium ion (about 229 kJ/mol). For all the europium complexes using these carboxylic acids, good red light emission was observed by the LED emitting ultraviolet light of 375 nm. Further, with respect to the triplet energies of a mother compound and the carboxylic acid, in the case of coumarin, the triplet energy of coumarin is 258 kJ/mol, and that of coumarin carboxylic acid derived from coumarin is 255 kJ/mol. The difference therebetween is as small as 3 kJ/mol, so that it is shown that the triplet energy value of the mother compound gives an indication.

Comparative Example 1

Using as raw materials carboxylic acids of 10 to 12 shown in Table 1 and phenanthroline as an auxiliary ligand, europium complexes were synthesized in the same manner as in Example 1. For the three kinds of europium complexes synthesized, the presence or absence of red light emission was measured by an LED emitting ultraviolet light of 375 nm. The results thereof are shown in Table 1. From the results of Table 1, the triplet energies of the carboxylic acids of 10 to 12 were lower than the excited-state energy level of the europium ion (about 229 kJ/mol). All the europium complexes using these carboxylic acids did not emit light by the LED emitting ultraviolet light of 375 nm.

Example 2

Evaluation of light stability was performed using a europium (Eu) complex having a structure shown below. As a result, the residual ratio of a red fluorescent material showed 96%, and the light stability was good.

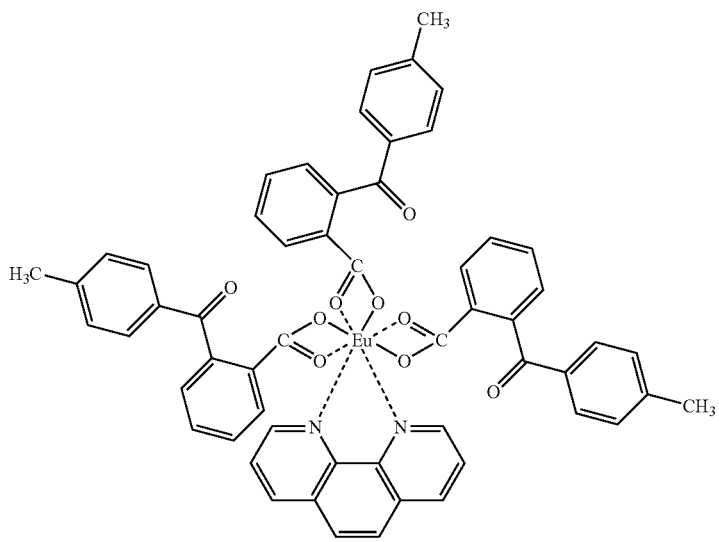

Example 3

Evaluation of light stability was performed in the same manner as in Example 2 with the exception that a Eu complex having a structure shown below was used in place of the Eu complex used in Example 2. As a result, the residual ratio of a red fluorescent material showed 90%, and the light stability was good.

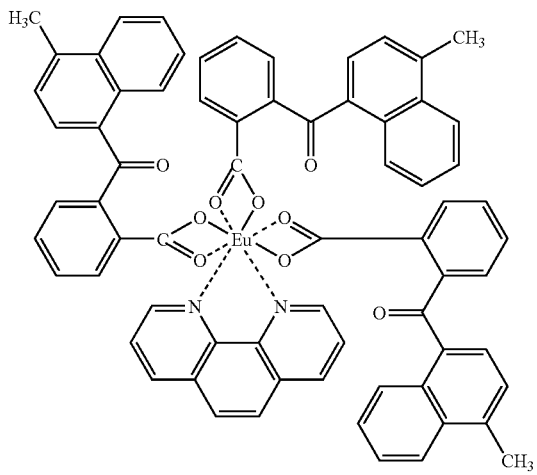

Comparative Example 2

Evaluation of light stability was performed in the same manner as in Example 2 with the exception that Eu(TTA)$_3$Phen (wherein TTA represents 1-(2-thenoyl)-4,4,4-trifluoro-1,3-butanedionate, and Phen represents 1,10-phenanthroline), a β-diketone-based complex having a structure shown below, was used in place of the Eu complex used in Example 2. As a result, the residual ratio of a red fluorescent material showed about 10%, resulting in poor light stability.

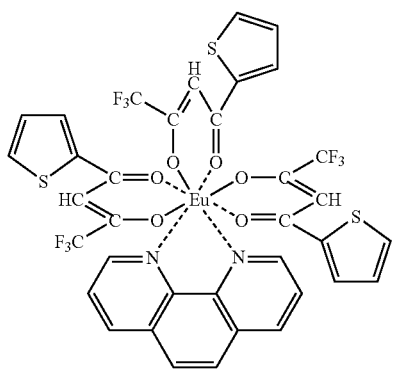

Comparative Example 3

Evaluation of light stability was performed in the same manner as in Example 2 with the exception that Eu(DBM)$_3$Phen (wherein DBM represents dibenzoylmethane), a β-diketone-based complex having a structure shown below, was used in place of the Eu complex used in Example 2. As a result, the residual ratio of a red fluorescent material showed about 18%. From these results, it is known that the carboxylic acid-based complexes are substantially excellent in light stability, compared to the diketone-based complexes.

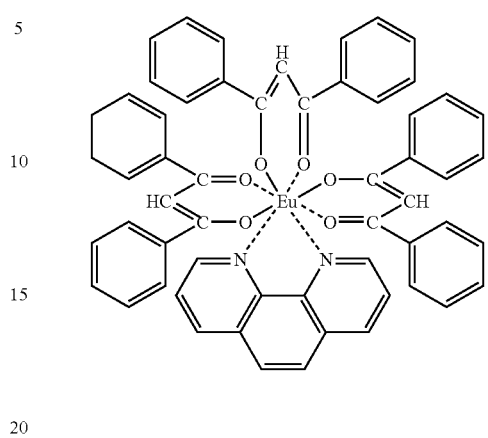

Example 4

A powder of the Eu complex used in Example 2 was packed into a metal cell having a diameter of 10 mm and a depth of 2 mm, and the light emission spectral intensity thereof was measured. For comparison, a powder of an inorganic red fluorescent material Y$_2$O$_2$S:Eu was similarly measured. The light emission intensities of peak wavelengths of light emission spectra at light excitation of 375 nm were compared. As a result, in the Eu complex used in Example 2, a light emission spectral intensity of about 1.6 times that of the powder of the inorganic red fluorescent material Y$_2$O$_2$S:Eu was observed.

Example 5

The light emission intensities of peak wavelengths of light emission spectra at light excitation of 395 nm were compared in the same manner as in Example 4 with the exception that the Eu complex was replaced by the Eu complex used in Example 3. As a result, in the Eu complex used in Example 3, a light emission spectral intensity of about 1.5 times that of the powder of the inorganic red fluorescent material Y$_2$O$_2$S:Eu was observed.

Example 6

The Eu complex used in Example 2, a blue fluorescent material (Sr, Ca, Ba, Mg)$_{10}$(PO$_4$)$_6$Cl:Eu and a green fluorescent material ZnS:Cu, Au, Al were mixed at a ratio of 22:15:63 by weight, and the resulting mixture was dispersed in an aqueous solution of polyvinyl alcohol. The resulting dispersion was applied onto a glass slide and dried to prepare a fluorescent material layer. This fluorescent material layer was irradiated with ultraviolet light of an LED (product name: NSHU 550, manufactured by Nichia Corporation) having a peak wavelength of 375 nm to obtain white light having neutral white 5000 K chromaticity coordinates (x, y=(0.345, 0.354).

Example 7

Synthesis of Eu(AQ2CA)$_3$Phen

In 100 ml of a mixed solvent of ethanol/water=100/3 (volume ratio), 0.76 g (3.0 mmol) of anthraquinone-2-carboxylic acid (hereinafter referred to as AQ2CA), 0.20 g (1.0 mmol) of 1,10-phenanthroline monohydrate and 0.32 g (3.0 mmol) of 2,2'-iminodiethanol were dissolved under reflux. To this solution, a solution obtained by dissolving 0.37 g (1 mmol) of europium chloride (III) hexahydrate in 20 ml of ethanol was added dropwise under reflux taking 2 hours, followed by further reflux for 1 hour. Then, after retention at 60° C. for 1 hour and further at 40° C. for 1 hour, the resulting solution was allowed to cool to room temperature. A precipitate thus formed was filtered by suction, and washed with ethanol. The resulting light yellow powder was dried under vacuum at 80° C., and then, heat treated at 160° C. for 1 hour to obtain Eu(AQ2CA)$_3$Phen.

The light emission spectrum at excitation of 405 nm of this Eu(AQ2CA)$_3$Phen was confirmed. As a result, there was obtained a light emission intensity of 2.3 times in the area ratio of the light emission spectrum, and that of 2.0 times in the light emission intensity ratio at the peak wavelength of the light emission spectrum, compared to an inorganic fluorescent material La$_2$O$_2$S:Eu (KX-681 manufactured by Kasei Optonix, Ltd.). The "area of the light emission spectrum" as used in the present invention means the integrated intensity of the light emission spectrum observed in the wavelength range of 500 nm to 600 nm. Further, a light emission excitation spectrum was measured. As a result, light was emitted at approximately equal intensity even by light having a longer wavelength than 420 nm, and the excitation wavelength was substantially shifted to the long wavelength side, compared to the inorganic fluorescent material La$_2$O$_2$S:Eu.

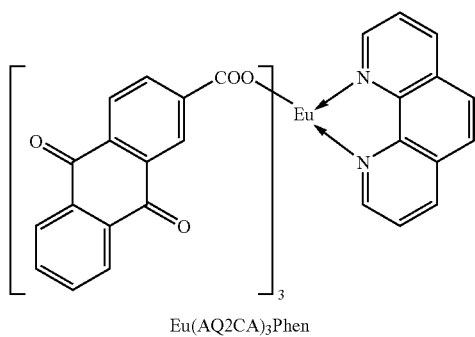

Eu(AQ2CA)$_3$Phen

Example 8

Synthesis of Eu(p-DBFBA)$_3$Phen

In 60 ml of a mixed solvent of tetrahydro-furan/acetonitrile=2/3 (volume ratio), 0.32 g (1.0 mmol) of p-DBFBA represented by the structure shown below, 0.07 g (0.33 mmol) of 1,10-phenanthroline monohydrate and 0.11 g (1.0 mmol) of 2,2'-iminodiethanol were dissolved under reflux. To this solution, a solution obtained by dissolving 0.12 g (0.33 mmol) of europium chloride (III) hexahydrate in 20 ml of a mixed solvent of ethanol/acetonitrile=1/3 (volume ratio) was added dropwise under reflux taking 1 hour. Then, after retention at 60° C. for 1 hour and further at 50° C. for 1 hour, the resulting solution was allowed to stand at room temperature for about 15 hours. A precipitate thus formed was filtered by suction, and washed with ethanol. The resulting white powder was dried under vacuum at 80° C., and then, heat treated at 160° C. for 1 hour to obtain Eu(p-DBFBA)$_3$Phen.

The light emission spectrum at excitation of 405 nm of this Eu(p-DBFBA)$_3$Phen was confirmed. As a result, there was obtained a light emission intensity of 2.2 times in the area ratio of the light emission spectrum, and that of 2.0 times in the light emission intensity ratio at the peak wavelength of the light emission spectrum, compared to the inorganic fluorescent material La$_2$O$_2$S:Eu (KX-681 manufactured by Kasei Optonix, Ltd.). Further, a light emission excitation spectrum was measured. As a result, the excitation wavelength was shifted to the long wavelength side, compared to the inorganic fluorescent material La$_2$O$_2$S:Eu.

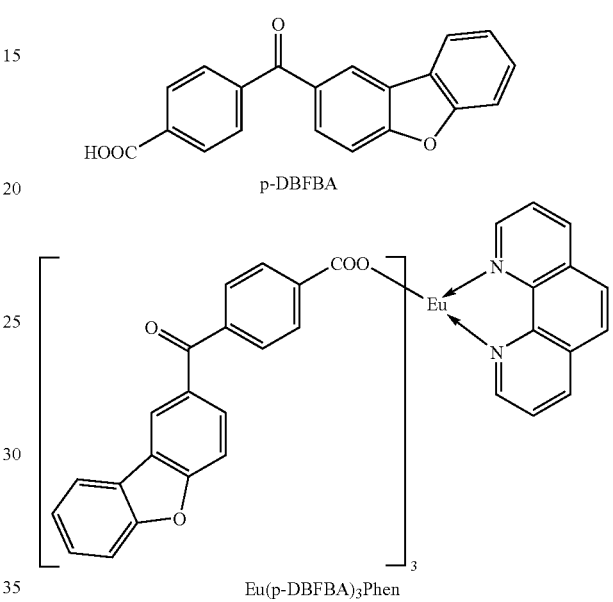

p-DBFBA

Eu(p-DBFBA)$_3$Phen

Example 9

Synthesis of Eu(p-DBTBA)$_3$Phen

In 60 ml of a mixed solvent of tetrahydro-furan/acetonitrile=1/4 (volume ratio), 0.33 g (1.0 mmol) of p-DBTBA represented by the structure shown below, 0.07 g (0.33 mmol) of 1,10-phenanthroline monohydrate and 0.11 g (1.0 mmol) of 2,2'-iminodiethanol were dissolved under reflux. To this solution, a solution obtained by dissolving 0.12 g (0.33 mmol) of europium chloride (III) hexahydrate in 15 ml of a mixed solvent of ethanol/tetrahydrofuran=1/2 (volume ratio) was added dropwise under reflux taking 1 hour. Then, the resulting solution was retained at 60° C., 40° C., 25° C. and 0° C., respectively, for every 1 hour. A precipitate thus formed was filtered by suction, and washed with ethanol. The resulting light yellow powder was dried under vacuum at 100° C. to obtain Eu(p-DBTBA)$_3$Phen.

The light emission spectrum at excitation of 405 nm of this Eu(p-DBTBA)$_3$Phen was confirmed. As a result, there was obtained a light emission intensity of 3.2 times in the area ratio of the light emission spectrum, and that of 2.4 times in the light emission intensity ratio at the peak wavelength of the light emission spectrum, compared to the inorganic fluorescent material La$_2$O$_2$S:Eu (KX-681 manufactured by Kasei Optonix, Ltd.). Further, a light emission excitation spectrum was measured. As a result, the excitation wavelength was shifted to the long wavelength side, compared to the inorganic fluorescent material La$_2$O$_2$S:Eu.

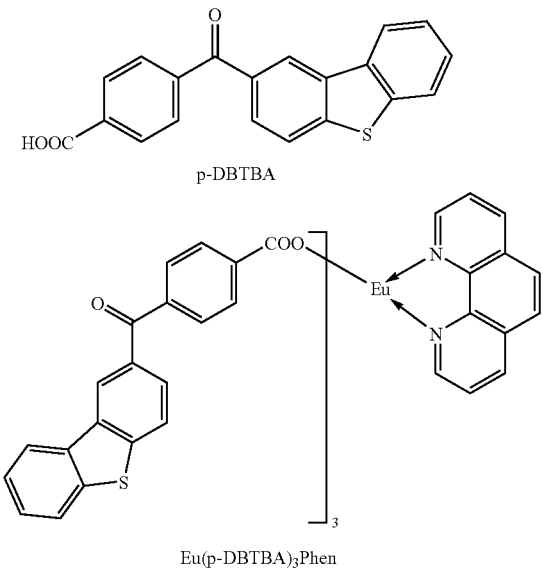

Eu(p-DBTBA)₃Phen

Example 10

Synthesis of Eu(o-DBTBA)₃(TPPO)₂

In 40 ml of ethanol, 0.33 g (1.0 mmol) of o-DBTBA represented by the structure shown below, 0.19 g (0.67 mmol) of triphenylphosphine oxide (hereinafter referred to as TPPO) and 0.11 g (1.0 mmol) of 2,2'-iminodiethanol were dissolved. To this solution, a solution obtained by dissolving 0.12 g (0.33 mmol) of europium chloride (III) hexahydrate in 10 ml of ethanol was added dropwise under reflux taking 1 hour. Then, after retention at 40° C. for 2 hours, the resulting solution was allowed to stand at room temperature for about 15 hours. A precipitate thus formed was filtered by suction, and washed with ethanol. The resulting light yellow powder was dried under vacuum at 100° C. to obtain Eu(o-DBTBA)₃(TPPO)₂.

This Eu(o-DBTBA)₃(TPPO)₂ was irradiated with LED light having a peak wavelength of 400 nm. As a result, red light emission was confirmed.

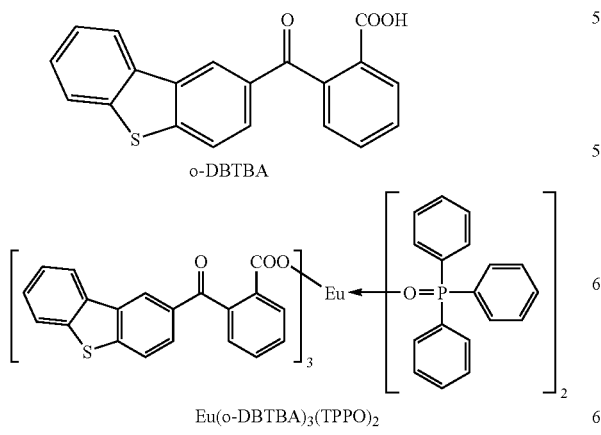

Eu(o-DBTBA)₃(TPPO)₂

Example 11

Synthesis of Eu(AQ1SA)₃Phen

In 80 ml of a mixed solvent of ethanol/water=1/2 (volume ratio), 0.93 g (3.0 mmol) of sodium anthraquinone-1-sulfonate, and 0.20 g (1.0 mmol) of Phen were dissolved under heating (about 60° C.). To this solution, a solution obtained by dissolving 0.37 g (1 mmol) of europium chloride (III) hexahydrate in 20 ml of ethanol was added dropwise at 60° C. taking 1 hour. After reflux for 1 hour, the resulting solution was allowed to cool to room temperature. A precipitate thus formed was filtered by suction, and washed with water. The resulting yellow powder was dried under vacuum at 100° C., and heat treated at 160° C. for 1 hour to obtain Eu(AQ1SA)₃Phen. AQ1SA represents anthraquinone-1-sulfonic acid.

This Eu(AQ1SA)₃Phen was irradiated with LED light having a peak wavelength of 400 nm. As a result, red light emission was confirmed.

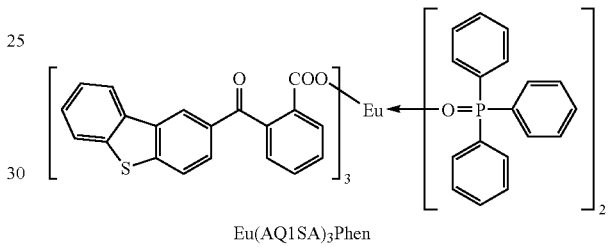

Eu(AQ1SA)₃Phen

Example 12

Synthesis of Eu(o-DBTBSA)₃Phen

In 80 ml of a mixed solvent of tetrahydro-furan/ethanol=9/1 (volume ratio), 0.51 g (1.5 mmol) of o-DBTBSA represented by the structure shown below, 0.10 g (0.5 mmol) of 1,10-phenanthroline monohydrate and 0.16 g (1.5 mmol) of 2,2'-iminodiethanol were dissolved under reflux. To this solution, a solution obtained by dissolving 0.17 g (0.50 mmol) of europium chloride (III) hexahydrate in 15 ml of a mixed solvent of ethanol/tetrahydrofuran=3/1 (volume ratio) was added dropwise under reflux taking 1 hour. Then, the resulting solution was allowed to cool to room temperature. To this solution, 80 ml of ethanol was slowly added, and a precipitate formed was filtered by suction and washed with ethanol. The resulting yellowish brown powder was dried under vacuum at 100° C., and then, heat treated at 160° C. for 1 hour to obtain Eu(o-DBTBSA)₃Phen.

This Eu(o-DBTBSA)₃Phen was irradiated with LED light having a peak wavelength of 400 nm. As a result, red light emission was confirmed.

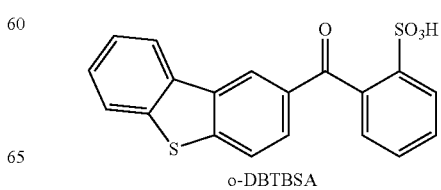

o-DBTBSA

-continued

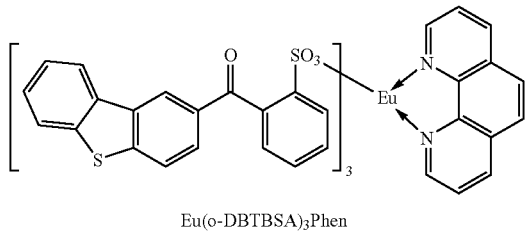

Eu(o-DBTBSA)₃Phen

Example 13

Synthesis of Eu(IQSA)₃Phen

In 50 ml of ethanol, 0.63 g (3.0 mmol) of isoquinoline-5-sulfonic acid (hereinafter referred to as IQSA), 0.20 g (1.0 mmol) of 1,10-phenanthroline monohydrate and 0.32 g (3.0 mmol) of 2,2'-iminodiethanol were dissolved under reflux. To this solution, a solution obtained by dissolving 0.37 g (1.0 mmol) of europium chloride (III) hexahydrate in 20 ml of ethanol was added dropwise under reflux taking 1 hour. After further reflux for 1 hour, the resulting solution was allowed to cool to room temperature. A precipitate formed was filtered by suction and washed with ethanol. The resulting white powder was dried under vacuum at 100° C., and then, heat treated at 160° C. for 1 hour to obtain Eu(IQSA)₃Phen.

This Eu(IQSA)₃Phen was irradiated with LED light having a peak wavelength of 375 nm. As a result, red light emission was confirmed.

IQSA

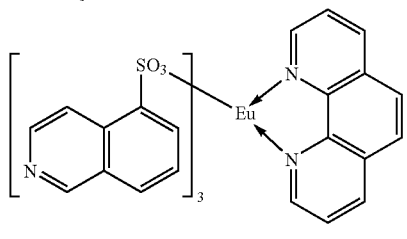

Eu(IQSA)₃Phen

Example 14

Synthesis of Eu(DPPA)₃Phen

Eu(DPPA)₃Phen was obtained in the same manner as in Example 13 with the exception that IQSA was replaced by 3.0 mmol of diphenylphosphinic acid (DPPA) represented by the structure shown below.

This Eu(DPPA)₃Phen was irradiated with LED light having a peak wavelength of 400 nm. As a result, red light emission was confirmed.

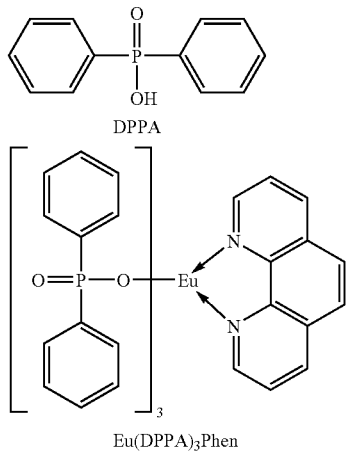

DPPA

Eu(DPPA)₃Phen

Example 15

Synthesis of Tb(o-DBFBA)₃Phen

In 50 ml of ethanol, 0.95 g (3.0 mmol) of o-DBFBA represented by the structure below, 0.20 g (1.0 mmol) of 1,10-phenanthroline monohydrate and 0.32 g (3.0 mmol) of 2,2'-iminodiethanol were dissolved under reflux. To this solution, a solution obtained by dissolving 0.37 g (1.0 mmol) of terbium chloride (III) hexahydrate in 20 ml of ethanol was added dropwise under reflux taking 1 hour. Then, the resulting solution was allowed to cool to room temperature, and allowed to stand at room temperature for about 15 hours. A precipitate thus formed was filtered by suction, and washed with ethanol. The resulting white powder was dried under vacuum at 80° C., and then, heat treated at 160° C. for 1 hour to obtain Tb(o-DBFBA)₃Phen.

This Tb(o-DBFBA)₃Phen was irradiated with LED light having a peak wavelength of 375 nm. As a result, green light emission was confirmed.

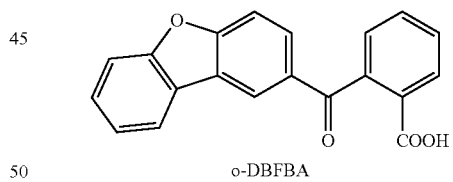

o-DBFBA

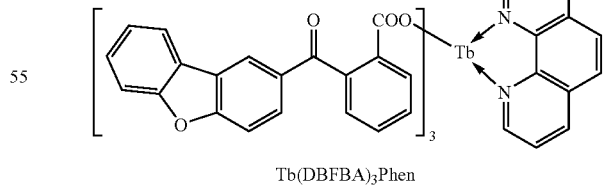

Tb(DBFBA)₃Phen

Example 16

Synthesis of Tb(o-DBTBA)₃Phen

In 50 ml of ethanol, 0.99 g (3.0 mmol) of o-DBTBA represented by the structure shown below, 0.20 g (1.0 mmol)

of 1,10-phenanthroline monohydrate and 0.32 g (3.0 mmol) of 2,2'-iminodiethanol were dissolved under reflux. To this solution, a solution obtained by dissolving 0.37 g (1.0 mmol) of terbium chloride (III) hexahydrate in 20 ml of ethanol was added dropwise under reflux taking 1 hour, and the resulting solution was allowed to cool to room temperature. A precipitate thus formed was filtered by suction, and washed with ethanol. The resulting white powder was recrystallized from a THF solution, and dried under vacuum at 80° C. to obtain Tb(o-DBTBA)$_3$Phen.

This Tb(o-DBTBA)$_3$Phen was irradiated with LED light having a peak wavelength of 375 nm. As a result, green light emission was confirmed.

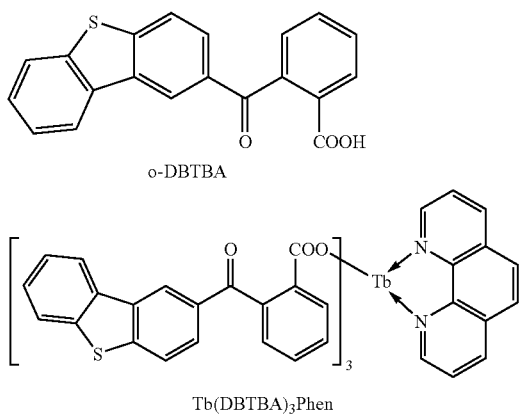

While the present invention has been described in detail with reference to specific embodiments thereof, it will be apparent to one skilled in the art that various changes and modifications can be made therein without departing from the spirit and scope thereof.

This application is based on Japanese Patent Application No. 2003-144388 filed on May 22, 2003, the entire content thereof being herein incorporated by reference.

INDUSTRIAL APPLICABILITY

According to the present invention, there can be provided a light emitting device which can generate high-intensity light emission, using a fluorescent material containing a rare earth element ion complex and being excellent in durability, and the fluorescent material to be used therein.

The invention claimed is:

1. A light emitting device comprising a semiconductor light emitting element which emits light within the region from near-ultraviolet light to visible light, and a fluorescent material which contains a rare earth element ion complex having an aromatic ring-containing Bronsted acid ion with a pKa value of 7 or less as a ligand and emits light by the action of light of said semiconductor light emitting element, wherein a Bronsted acid ion represented by general formula (2) shown below, which is derived from an aromatic ring-containing Bronsted acid represented by general formula (1) shown below, is used as said ligand

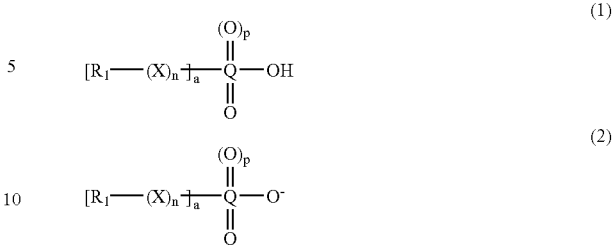

wherein $R_1$ is a group containing at least one aromatic hydrocarbon ring or aromatic heterocycle, each optionally having a substituent group at less than all available positions, X is a divalent connecting group, Q represents a carbon, sulfur or phosphorous atom, a represents 1 or 2, n represents 0 or 1, and p represents 0 or 1, and wherein when said Bronsted acid is an optionally substituted benzophenone carboxylic acid, the carboxylic acid group lies at an ortho position relative to the carbonyl group.

2. The light emitting device according to claim 1, wherein a rare earth element used in a rare earth element ion which forms said rare earth element ion complex is an element selected from the group consisting of praseodymium, samarium, europium, terbium, dysprosium, holmium, erbium and thulium.

3. The light emitting device according to claim 2, wherein the rare earth element used in the rare earth element ion which forms the rare earth element ion complex is europium or terbium.

4. The light emitting device according to claim 1, wherein said ligand is one in which the triplet energy of a mother compound of said Bronsted acid ion is higher than an excited-state energy level that is involved in light emission of the rare earth element ion.

5. The light emitting device according to claim 1, wherein said fluorescent material is a fluorescent material containing a rare earth element ion complex represented by the following general formula (5):

$$A_3LD_r \qquad (5)$$

wherein A represents the Bronsted acid ion of said general formula (2) which may be different from one another, L represents a rare earth element ion, D represents an auxiliary ligand comprising a Lewis base, and r represents 0, 1 or 2.

6. The light emitting device according to claim 1, wherein said fluorescent material contains a rare earth element ion complex in which said Bronsted acid ion as a ligand is an aromatic ketone-containing group.

7. The light emitting device according to claim 1, wherein said fluorescent material contains a rare earth element ion complex having as a ligand said Bronsted acid ion having a group containing a tricyclic aromatic hydrocarbon and/or a tricyclic aromatic heterocycle.

8. The light emitting device according to claim 1, wherein said fluorescent material is a resin composition in which said rare earth element ion complex is mixed or dispersed.

9. The light emitting device according to claim 1, wherein said Bronsted acid ion is a carboxylic acid ion or a sulfonic acid ion.

10. The light emitting device according to claim 1, wherein said semiconductor light emitting element is a laser diode or light emitting diode having a peak wavelength within the range of 360 nm to 470 nm.

11. The light emitting device according to claim 1, wherein the device comprises another fluorescent material which emits light by the action of light of said semiconductor light emitting element, together with the fluorescent material containing rare earth element ion complex, which emits light by the action of light of said semiconductor light emitting element.

12. The light emitting device according to claim 1, wherein the light emitting device is a lighting system.

* * * * *